United States Patent [19]
Yamazaki et al.

[11] Patent Number: 5,840,600
[45] Date of Patent: Nov. 24, 1998

[54] METHOD FOR PRODUCING SEMICONDUCTOR DEVICE AND APPARATUS FOR TREATING SEMICONDUCTOR DEVICE

[75] Inventors: Shunpei Yamazaki, Tokyo; Mitsunori Sakama, Kanagawa; Yasuhiko Takemura, Kangawa, all of Japan

[73] Assignee: Semiconductor Energy Laboratory Co., Ltd., Kanagawa, Japan

[21] Appl. No.: 521,534

[22] Filed: Aug. 30, 1995

[30]  Foreign Application Priority Data

| Aug. 31, 1994 | [JP] | Japan | 6-232410 |
| Aug. 31, 1994 | [JP] | Japan | 6-232411 |
| Aug. 31, 1994 | [JP] | Japan | 6-232412 |

[51] Int. Cl.$^6$ .......... H01L 21/02; H01L 21/302; H01L 21/324; H01L 21/329
[52] U.S. Cl. .......... 438/151; 438/164
[58] Field of Search .......... 438/151, 164

[56]  References Cited

U.S. PATENT DOCUMENTS

| 5,147,826 | 9/1992 | Liu et al. | 437/233 |
| 5,237,188 | 8/1993 | Iwai et al. | 257/325 |
| 5,275,851 | 1/1994 | Fonash et al. | 427/578 |
| 5,426,064 | 6/1995 | Zhang et al. | 437/40 |
| 5,525,550 | 6/1996 | Kato | 437/238 |
| 5,545,571 | 8/1996 | Yamazaki et al. | 437/21 |
| 5,591,681 | 1/1997 | Wristers et al. | 437/240 |
| 5,663,077 | 9/1997 | Adachi et al. | 438/151 |

FOREIGN PATENT DOCUMENTS

63-15468   1/1988   Japan .

OTHER PUBLICATIONS

G. Liu et al., "Polycrystalline silicon thin film transistors on Corning 7059 glass substrates using short time, low–temperature processing," Appl. Phys. Lett. 62(20), May 17, 1993, pp. 2554–2556.

G. Liu et al., "Selective area crystallization of amorphous silicon films by low–temperature rapid thermal annealing," Appl. Phys. Lett. 55(7), Aug. 14, 1989, pp. 660–662.

S. Wolf, "Silicon Processing for the VLSI Era, vol. 3," Lattice Press, Sunset Beach, CA (1995) pp. 648–651.

A. T. Wu et al., "Nitradation–induced surface donor layer in silicon," Appl. Phys. Lett. V. 55, No. 16 pp. 1665–1667, 1989.

J. Ahn et al., "High quality thin gate oxide prepared by annealing low pressure chemical vapor deposited $SiO_2$ in $N_2O$," Appl. Phys. Lett. V. 59, No. 3, pp. 283–285, Jul. 1991.

S.C. Kim et al. "Effects of $N_2$ plasma treatment on $SiO_2$ gate insulator in a–Si:H thin film transistor," Mat Res. Soc. Symp. Proc. vol. 336, 1994, pp. 775–780.

Primary Examiner—Douglas W. Robinson
Assistant Examiner—Everett White
Attorney, Agent, or Firm—Sixbey, Friedman, Leedom & Ferguson, P.C.; Gerald J. Ferguson, Jr.; Jeffrey L. Costellia

[57]  ABSTRACT

In forming an insulating film for a thin film transistor (TFT), a thermal oxidation film is formed by oxidation of silicon film at 500° to 700° C. or an insulating film composed mainly of silicon oxide deposited by physical vapor deposition (PVD) or chemical vapor deposition (CVD) is formed so as to cover island-like crystalline silicon, and then the resulting film is annealed at 400° to 700° C., preferably 450° to 650° C. in a highly reactive atmosphere of nitrogen oxide which is photoexcited or photodecomposed by ultraviolet rays. The thus modified silicon oxide film is used as the gate insulating film.

25 Claims, 21 Drawing Sheets

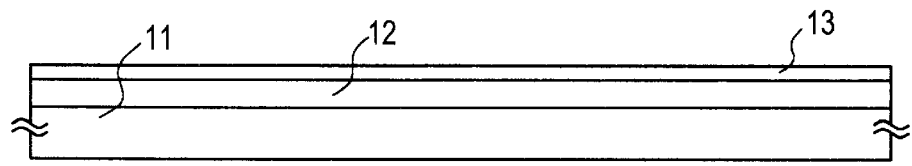
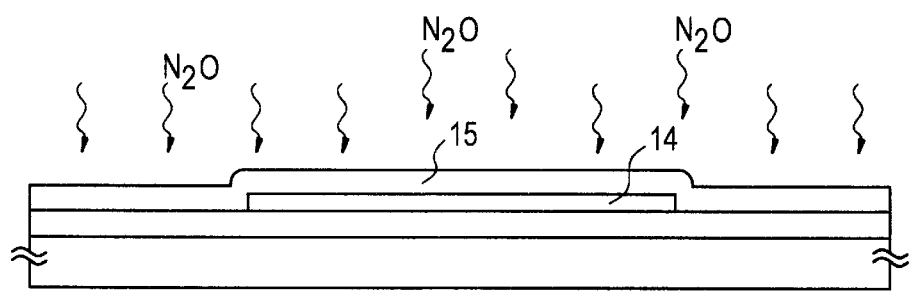
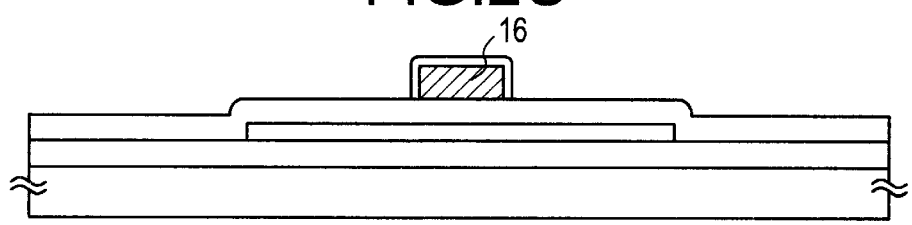
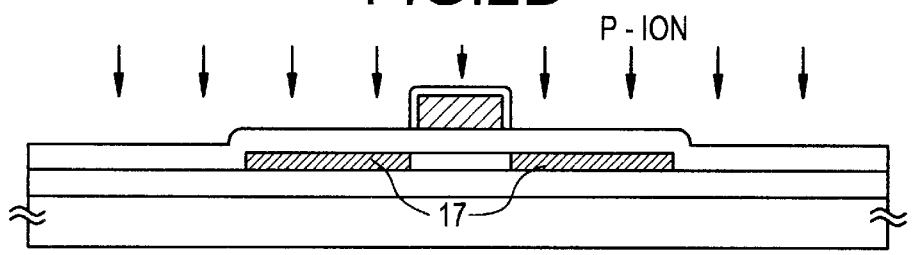
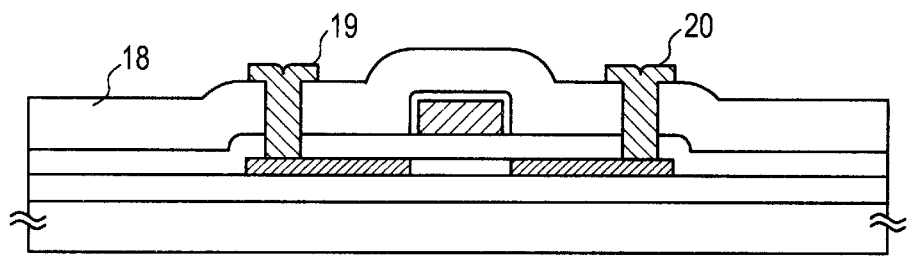

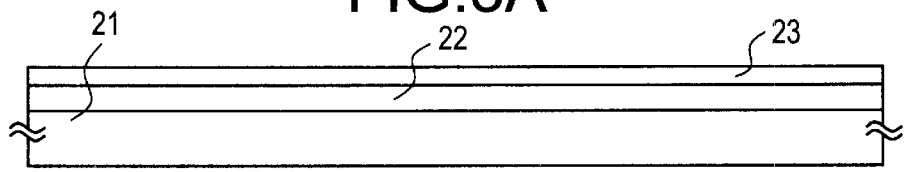
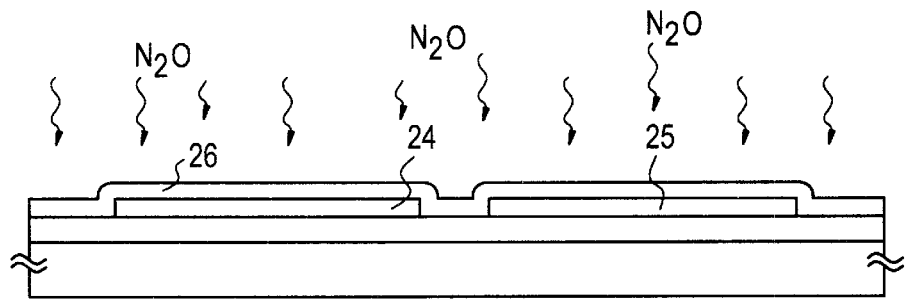
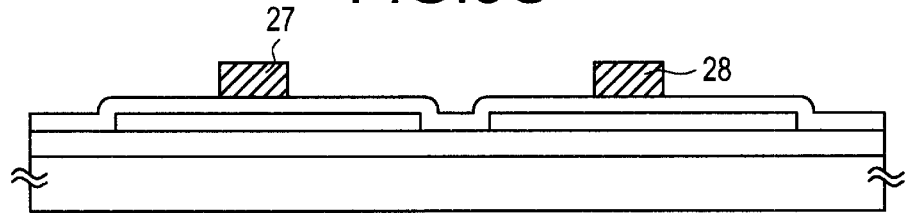
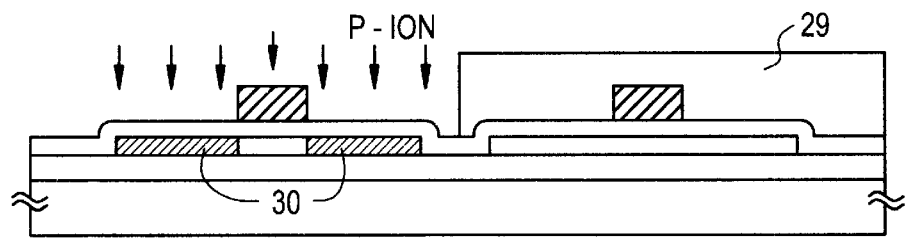
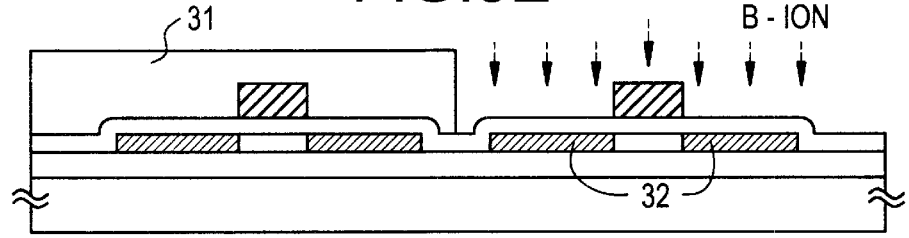
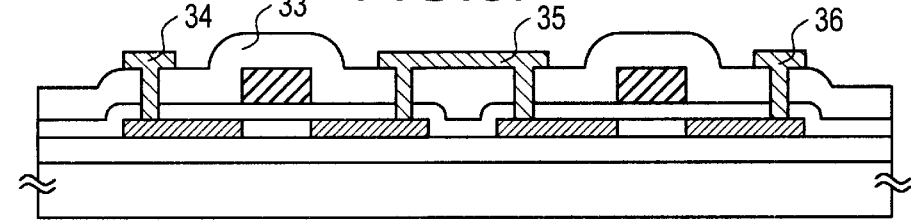

a : NO TREATMENT
b : $N_2O$ ANNEALING
c : $NH_3$ ANNEALING

▲ poly - Si : 550 °C / 1 atm.
△ poly - Si : 600 °C / 1 atm.
● poly - Si : 550 °C / 10 atm.
○ poly - Si : 600 °C / 10 atm.

METHOD FOR PRODUCING SEMICONDUCTOR DEVICE AND APPARATUS FOR TREATING SEMICONDUCTOR DEVICE

BACKGROUND OF THE INVENTION

The present invention relates to: a semiconductor device, such as thin film transistor (TFT) and thin film diode (TFD), having an insulated gate structure using a silicon film formed on an insulating substrate, such as glass, or on an insulating film formed on an adequate substrate; a thin film integrated circuit, especially the one for an active liquid crystal display unit, which employs the semiconductor device; a method for producing the semiconductor device and integrated circuit; a method for treating and producing the gate insulating film for the semiconductor device at a maximum process temperature of 700° C. or lower, preferably 650° C. or lower; and an apparatus for treating and producing the gate insulating film.

Development has recently proceeded in the semiconductor device having TFTs formed on an insulating substrate such as glass, such semiconductor device being exemplified by active liquid crystal displays and image sensors which employ TFTs to drive their picture elements. Glass substrates in general use from the standpoint of price and productivity are those which have a strain point temperature of 750° C. or lower, typically 550° C. to 680° C. For such glass substrates, it is necessary to keep the process temperature of 700° C. or lower, preferably 650° C. or less.

A TFT for the semiconductor device usually employs a silicon semiconductor thin film. It is roughly classified into two groups, amorphous silicon semiconductor (a—Si) and crystalline silicon semiconductor. The amorphous silicon semiconductor is in general use because it can be produced comparatively easily by vapor phase process at a low temperatures and hence it is suitable for mass production. However, it is inferior to crystalline silicon semiconductor in physical properties such as electric field effect mobility and conductivity. To improve the high speed characteristics in the future, it is necessary to establish a method for producing TFT from crystalline silicon semiconductor.

A TFT based on amorphous silicon with a low mobility is hardly influenced by the gate insulating film, which is made of silicon nitride inferior to silicon oxide in electrical properties. By contrast, a TFT based on crystalline silicon with a high mobility is greatly influenced by the gate insulating film, similar to the silicon film itself.

Improvements in the technology of producing crystalline silicon film has generated a great demand for the gate insulating film of good quality. The gate insulating film essentially determines the electrical properties of a TFT in which the channel is formed substantially from single crystal of silicon or uniformly oriented several crystals of silicon. This state is the monodomain. Unlike a TFT based on ordinary polycrystalline silicon, such a TFT is little affected by the grain boundary. Therefore, its electrical characteristic may be determined by a characteristic of the gate insulating film.

In the ordinary polycrystalline structure, two adjacent crystals forming a grain boundary differ from each other in crystal orientation and hence a high grain boundary barrier produces, whereas in the monodomain structure, two adjacent crystals forming a grain boundary (corresponding to that of ordinary polycrystals) generate a very low grain boundary barrier because they are oriented in the same direction. Therefore, the characteristics of a TFT of monodomain structure depend on the gate insulating film rather than the grain boundary.

It is known that a satisfactory gate insulating film is obtained by thermal oxidation on a heat-resistant substrate (such as quartz), as disclosed in Japanese Patent Publication No. 3-71793.

The advantage of the thermal oxidation film is that it deteriorates little in characteristic properties because it has a very few defects which trap charges such as hot electrons injected thereinto. This leads to the high reliability of the device. On the other hand, the disadvantage of the thermal oxidation film to be used as the gate insulating film is that it has to be formed at a high temperature of 950° C. or higher. The only substrate material that withstands such a high temperature is quartz. Glass substrates, which have a low strain point, are not suitable for the thermal oxidation process because their process temperatures have to be 700° C. or lower, preferably 650°C. or lower.

However, under special conditions, such as high-pressure steam oxidation, it is possible to form a thermal oxidation film even at 700° C. or lower. For example, it is possible to form a 100–1000 Å thick film by thermal oxidation at 500°–700° C. Unfortunately, the resulting film has a higher hydrogen content than the film obtained at a high temperature, and hence a TFT employing it as the gate insulating film is extremely poor in characteristic properties.

For this reason, the gate insulating film has to be formed by physical vapor deposition (such as sputtering) or chemical vapor deposition (such as plasma CVD and thermal CVD), which can be carried out at 650° C. or lower.

However, the insulating film formed by PVD or CVD suffers a large number of dangling bonds and a high hydrogen content and is poor in interface characteristics. Therefore, it is vulnerable to the injection of hot electrons and tends to form charge trapping centers (or recombination centers) resulting from dangling bonds and hydrogen. This leads to a low voltage resistance. Recombination centers are formed mostly at the interface with crystalline silicon. When used as the gate insulating film for a TFT, it is poor in field mobility and subthreshold value (S value) and suffers a large amount of leakage current in the gate electrode. This results in a decrease (or deterioration and change with time) in on-state current. For this reason, a technology for forming thermal oxidation film at low temperatures is much sought after.

In principle, it is possible to form film of a pure compound consisting of oxygen and silicon if a target of artificial quartz (consisting of high-purity oxygen and silicon) is used in sputtering as PVD. In practice, however, it is quite difficult to obtain a silicon oxide film containing oxygen and silicon in almost stoichiometric amounts and having only a few dangling bonds.

It is possible to form a silicon oxide film with a nearly stoichiometric composition, if oxygen is used as the sputtering gas. However, this is impractical for mass production because oxygen has a low atomic weight and is slow in sputtering rate (or deposition rate). Any attempt to increase the film forming rate by employing argon as the sputtering atmosphere results in an unsatisfactory gate insulating film containing oxygen and silicon in a non-stoichiometric ratio. Regardless of the sputtering atmosphere, the resulting film inevitably has some silicon dangling bonds. Therefore, it is necessary, after film forming, to convert silicon dangling bonds (Si. or SiO.) into Si—H or Si—OH by hydrogen annealing. Unfortunately, Si—H bonds and Si—OH bonds are unstable and are easily broken by accelerated electrons such as hot electrons, and they return to silicon dangling bonds. These weak Si—H and Si—OH bonds are responsible for deterioration by the injection of hot electrons.

Similarly, the silicon oxide film formed by plasma CVD also contains a large amount of hydrogen in the form of Si—H and Si—OH, and they present the above problem. Moreover, the problem with using tetraethoxysilane (TEOS) as a silicon source (which is comparatively easy to handle) is that the resulting silicon oxide film contains carbon.

SUMMARY OF THE INVENTION

It is an object of the present invention to improve the characteristic properties of a silicon oxide film deposited by PVD or CVD mentioned above.

In the present invention, the object is achieved by forming a thermal oxidation film by oxidation of silicon film at 500°–700° C. or by forming an insulating film composed mainly of silicon oxide which is deposited by PVD or CVD so as to cover island-like crystalline silicon, and then by annealing the resulting film at 400°–700° C. in a highly reactive atmosphere of nitrogen oxide which is photoexcited or photodecomposed by ultraviolet rays. The thus modified silicon oxide film is used as the gate insulating film.

The nitrogen oxides used in the present invention include dinitrogen oxide ($N_2O$), nitrogen monoxide (NO), and nitrogen dioxide ($NO_2$). They are represented by the general formula of $NO_x$, where $0.5 \leq x \leq 2.5$. The atmosphere of nitrogen oxide should be substantially free of water ($H_2O$), carbon dioxide ($CO_2$), and carbon monoxide (CO). Their content should be 1 ppm or lower, preferably 10 ppb or lower.

If necessary, the annealing of nitrogen oxide may be followed by the second annealing at 400°–700° C. in the atmosphere of hydrogen nitride, such as ammonia ($NH_3$) and hydrazine ($N_2H_4$) which are photoexcited or photodecomposed by ultraviolet rays. The hydrogen nitride is represented by the general formula of $NH_x$, where $1.5 \leq x \leq 3$. In this case, the atmosphere should be substantially free of water and carbon oxides, whose content should be 1 ppm or lower, preferably 10 ppb or lower.

In the present invention, "reactive nitrogen oxide" (or "reactive hydrogen nitride") represents the nitrogen oxide (or hydrogen nitride) which is photoexcited or photodecomposed by ultraviolet rays. The reactive nitrogen oxide (or reactive hydrogen nitride) may be pure nitrogen oxide or hydrogen nitride or may contain an inert gas such as argon. Annealing in the reactive nitrogen oxide or reactive hydrogen nitride improves the characteristic properties of silicon oxide film, especially the characteristic properties of its interface with silicon film.

Annealing in the reactive nitrogen oxide or reactive hydrogen nitride may be preceded or followed by annealing in the atmosphere of ordinary hydrogen nitride or nitrogen oxide (containing a small amount of excited molecules or active species), hydrogen, oxide, ozone, etc.

FIG. 1A shows an example of the apparatus of the present invention. The apparatus has a first reaction chamber 1 (in which nitrogen oxide or hydrogen nitride is excited by ultraviolet rays) and a second reaction chamber 2 (in which the reactive nitrogen oxide or hydrogen oxide generated in the first reaction chamber is introduced and the gate insulating film is annealed at 400°–700° C.). These reaction chambers and their connecting pipe should be kept at a proper temperature. The second reaction chamber 2 is provided with heaters 3, but the first reaction chamber 1 and the connecting pipe may also be provided with heaters, which are not shown in FIG. 1A.

The first reaction chamber should preferably be constructed such that the gas therein is irradiated with ultraviolet rays as effectively as possible to be made reactive. FIG. 1B is a schematic drawing of the first reaction chamber. There is shown a meandering pipe 6 (preferably of synthetic quartz) transparent to ultraviolet rays, into which the gas is introduced. Sources of ultraviolet rays (such as low-pressure mercury lamp) are arranged adjacent to the meandering pipe. FIG. 1C is a sectional view taken along the broken line in FIG. 1B. The low-pressure mercury lamps 7 are arranged between the pipes 6. The first reaction chamber should be kept at room temperature, preferably at 400°–700° C. In addition, the temperature of the first reaction chamber should be the same as that of the second reaction chamber so as to ensure the uniform temperature distribution in the second reaction chamber.

In the present invention, the lowest and highest temperatures in the second reaction chamber are determined respectively by the reaction rate and the substance (such as substrate) which undergoes heat treatment. The adequate temperature in the second reaction chamber, therefore, should be 400°–700° C., preferably 450°–650° C. The higher is the temperature in the second reaction chamber, the more readily proceeds the reaction. However, at high temperatures, glass substrates are likely to suffer heat shrinkage. This holds true especially at 650°–750° C. Heat shrinkage poses a problem with the formation of fine patterns. Therefore, the heat treatment of glass substrates should preferably be carried at their strain point temperature or lower.

If the connecting pipe between the first and second reaction chambers is at a low temperature, the gas molecules excited in the first reaction chamber return to their ground state, which decreases the reactivity. Therefore, in order to maintain a desired reactivity, it is desirable to keep the connecting pipe at an adequate temperature. In addition, it is desirable that the inner wall of the connecting pipe be lined with a quartz-based material to protect it from attack by reactive gas molecules. A preferred example of such a material is high-purity quartz composed of 90 mol % or more of silicon oxide.

If the inner wall is made of a metallic material, the excited molecules return to the ground state or recombine to become stable, thereby losing reactivity. The inner wall of quartz does not cause such troubles; it keeps many atoms and molecules active even at a distance 50–100 cm away from the first reaction chamber.

The second reaction chamber 2 is provided with susceptors 4 to hold a large number of substrates 5. This permits the treatment of a large number of substrates at one time. It is desirable that the pressure of the atmosphere in the second reaction chamber be kept lower than atmospheric pressure.

In the present invention, the gate insulating film may be formed by PVD (typified by sputtering) or CVD (typified by plasma CVD, low pressure CVD, and atmospheric pressure CVD). Other processes may also be employed. It is possible to perform plasma CVD or low pressure CVD by using TEOS as the raw material. If a silicon oxide film is to be deposited from TEOS and oxygen by plasma CVD, it is desirable that the substrate be kept at 200°–500° C. Low pressure CVD with TEOS and ozone proceeds at a comparatively low temperature (375°±20° C.), thereby to obtain a silicon oxide film free of plasma induced damage.

In the similar fashion, it is possible to form a silicon oxide film free of plasma damage by low pressure CVD which employs as raw materials monosilane ($SiH_4$) and oxygen ($O_2$) or monosilane and nitrogen oxide (such as dinitrogen oxide). The combination of monosilane and nitrogen oxide may be used for plasma CVD. Of several processes of plasma CVD, ECR-CVD is desirable which performs discharge under the condition of ECR (electron cyclotron resonance). It yields a satisfactory gate insulating film because it causes less damage due to plasma.

The present inventors found that an insulating film composed mainly of somewhat hard silicon oxide is adequate as the gate insulating film of TFT. A typical example is a silicon oxide film formed by etching with buffered hydrofluoric acid (a 1:50:50 mixture of hydrofluoric acid, ammonium fluoride, and acetic acid) at 23° C. at an etching rate of 1000Å/min or lower, preferably 300–800 Å/min. The requirement for this etching rate is met by a silicon oxide film containing nitrogen in an amount of $1 \times 10^{17}$ to $1 \times 10^{21}$ atoms/cm$^3$ on average.

In the present invention, the crystalline silicon to become the active layer is formed by using as the starting material the amorphous silicon film which is obtained by plasma CVD or low pressure CVD. There are two major methods for crystallization. The first method involves heat annealing for crystallization which is carried out for a proper time at 500°–650° C. after the amorphous silicon film is formed. The crystallization of amorphous silicon may be accelerated by addition of specific elements, such as nickel, iron, platinum, palladium, and cobalt. These elements lower the crystallization temperature and shorten the crystallization time. They should be used in an amount sufficient for crystallization but small enough not to adversely affect the characteristics of silicon semiconductor. The preferred amount is such that the minimum concentration in silicon film determined by secondary ion mass spectroscopy (SIMS) is $1 \times 10^{15}$ to $3 \times 10^{19}$ atoms/cm$^3$. The elements to accelerate crystallization varies in distribution depending on how the silicon film is treated, and the minimum value may be obtained at the interface or near the center of the film.

The second method is the so-called laser annealing which performs crystallization by irradiating the amorphous silicon film with an intense light such as laser. The selection of the first and second methods depends on the characteristics of TFT required, the apparatus available, and the amount of investment.

It is also possible to use the first and second methods in combination. For example, crystallization by heat annealing may be followed by laser annealing which enhances the crystallinity. This is effective in the case where heat annealing is carried out in the presence of nickel or any other elements which accelerate crystallization. In this case, some portions remain amorphous in the grain boundary, and they are effectively crystallized by laser annealing. Conversely, it is also possible to perform heat annealing on the silicon film which has been crystallized by laser annealing, so that the silicon film is relieved from strain caused by laser annealing.

Thermal oxidation film formed by oxidation at low temperatures (500°–700° C.) or silicon oxide film formed by CVD or PVD contains a large number of silicon dangling bonds, Si—H bonds, and Si—OH bonds. When the silicon oxide film is treated at high temperatures of 800° C. or higher in an atmosphere of dinitrogen oxide, the Si—H bonds in silicon oxide are nitrided or oxidized into Si≡N, $Si_2$=N—O bonds, Si—N=O bonds, etc. The Si—OH bonds undergo the same reaction. This reaction readily proceeds at the interface between silicon oxide and silicon, with the result that nitrogen concentrates at the silicon oxide-silicon interface. The amount of nitrogen at the interface is more than ten times the average amount in the silicon oxide film. Silicon oxide containing 0.1–10 atom % of nitrogen, typically 1–5 atom % of nitrogen, is desirable for the gate insulating film.

This reaction, however, does not proceed at low temperatures of 750° C. or lower, because dinitrogen oxide does not decompose at such low temperatures and hence there occur no active atoms and molecules which penetrate into the silicon oxide film. In other words, the reaction is restricted by the decomposition of dinitrogen oxide. The same applies to other nitrogen oxides (such as nitrogen monoxide and nitrogen dioxide), although they vary in their optimum temperature. In other words, it is impossible to improve the silicon oxide film and the interface between the silicon oxide film and the active layer at 400°–700° C., typically 450°–650° C., as intended in the present invention.

By contrast, it is possible to bring about the above-mentioned reaction if a reactive nitrogen oxide is used which contains active atoms and molecules which penetrate into the silicon oxide film even at low temperatures of 700° C. or lower. The present invention is based on the fact that under adequate conditions a reactive nitrogen oxide keeps its reactivity for a long time and moves from one place to another. Nitrogen oxide is made reactive by irradiation with ultraviolet rays, and the resulting reactive nitrogen oxide is introduced into the reaction chamber at 400°–700° C. so that it reacts with the gate insulating film. The process of the present invention requires 400°–700° C. for heat annealing, and this temperature is not for the decomposition of the nitrogen oxide but for the penetration of active atoms and molecules into the silicon oxide film.

Similar phenomena also take place in the atmosphere of hydrogen nitride such as ammonia and hydrazine. For example, the annealing of a silicon oxide film deposited by CVD or PVD in an atmosphere of ammonia at high temperatures of 850° C. or higher nitrides silicon dangling bonds, Si—H bonds, and Si—OH bonds and changes them into Si≡N bonds. This reaction does not proceed at 650° C. or lower, because it involves the decomposition of ammonia and requires high temperatures of 850° C. or higher to yield active nitrogen atoms. It follows, therefore, that the nitriding reaction will proceed even at low temperatures of 400°–700° C. if ammonia is previously made reactive.

Incidentally, the treatment with hydrogen nitride nitrides Si—H bonds and Si=O bonds into Si—N=$H_2$. This reaction takes place even when the hydrogen nitride is not reactive. Such bonds are converted into extremely stable Si≡N bonds and Si—N=O bonds by annealing in an atmosphere of dinitrogen oxide.

The reaction to the gate insulating film varies depending on whether hydrogen nitride is used or nitrogen oxide is used. This will be explained with reference to FIG. 7. Symbol a of FIG. 7 shows the results of determination by secondary ion mass spectroscopy (SIMS) of the nitrogen content in silicon oxide film deposited by sputtering on the active layer of crystalline silicon. The values are valid for only the part of silicon oxide (gate insulating film), and the nitrogen content is $1 \times 10^{18}$ atoms/cm$^3$. The nitrogen content peaks in the vicinity of the interface between the active layer and the gate insulating film. This is due to the discontinuity of material (or the matrix effect) and does not mean that the nitrogen content actually increases at the interface.

It is annealed for 1 hour in an atmosphere of nitrogen oxide using the apparatus of FIG. 1, with the first and second reaction chambers being kept at 600° C. Upon analysis by SIMS, the treated silicon oxide film gives the result indicated by b in FIG. 7. Like the result indicated by a, it is noted that the nitrogen content peaks at the interface, although the peak value in b is two orders of magnitude greater than that in a. This suggests the accumulation of nitrogen in the vicinity of the interface as well as the contribution of matrix effect.

The silicon oxide nitride film resulting from the accumulation of nitrogen at the interface is less liable to defects by injection of hot electrons because it has stronger atom-to-atom bonds. This leads to the improvement of the characteristic properties of the gate insulating film. Such improvement is usually satisfactory; however, a further improvement can be made if annealing is carried out in hydrogen nitride (such as ammonia) which is excited or decomposed by ultraviolet rays.

The annealing in dinitrogen oxide is followed by the second annealing for 1 hour in an atmosphere of ammonia which employs the apparatus of FIG. 1A, with the first and second reaction chambers kept at 600° C. Upon analysis by SIMS, the treated silicon oxide film gives the result indicated by c in FIG. 7. The concentration of nitrogen increases throughout the gate insulating film and it is not high particularly at the interface. As shown above, the treatment with ammonia converts silicon oxide into silicon oxide nitride. This results in an improvement of voltage resistance over the entire film.

The present invention produces a marked effect when it is applied to a silicon oxide film formed by sputtering, especially one which contains less oxygen than the stoichiometric amount. That is, annealing in an atmosphere of reaction nitrogen oxide makes up for the deficiency of oxygen in such a silicon oxide film, with its composition approaching the stoichiometric one. In a similar fashion, annealing in an atmosphere of reactive hydrogen nitride causes nitrogen to enter the site where oxygen should be, resulting in a silicone oxide nitride film which is electrically stable.

The above-foregoing suggests that the forming of silicon oxide film by sputtering is not disadvantageous. The conventional procedure for sputtering to form silicon oxide film has to be carried out in a limited atmosphere so that the resulting film has as stoichiometric a composition as possible. For example, an atmosphere composed of oxygen and argon must meet the requirement that the ratio of oxygen to argon be greater than one, with pure oxygen being preferable to a mixture. Such an atmosphere is not suitable for mass production because of low film forming rate. Reactive oxygen poses another problem with oxidation of the vacuum apparatus and chambers.

According to the present invention, it is possible to convert a silicon oxide film into one which is suitable for use as the gate insulating film even though it does not have a stoichiometric composition. This means that according to the present invention, it is possible to form a silicon oxide film advantageously (in terms of film forming rate) even in an atmosphere composed of oxygen and argon whose ratio is equal to one or smaller than one. In an extreme case, an atmosphere of pure argon can be used to form a silicon oxide film rapidly and stably.

The present invention produces a marked effect when it is applied to a silicon oxide film formed by plasma CVD or low pressure CVD which employs a carbon-containing silicon source such as TEOS. The disadvantage of using TEOS in the conventional process is that the resulting silicon oxide film contains a large amount of carbon, with carbon near the interface with silicon film impairing the characteristic properties of TFT. According to the present invention, it is possible to lower the carbon content in the film by annealing in an atmosphere of reactive nitrogen oxide. The annealing promotes oxidation of carbon, producing carbon oxide which is released.

This process is explained with reference to FIG. 5. (In this example, dinitrogen oxide is used as nitrogen oxide.) Reactive dinitrogen oxide is rich in atomic nitrogen and oxygen which easily penetrate into a silicon oxide film to combine with carbon (in the form Si—C bonds) therein, forming chemically stable carbon dioxide gas which is released, and to combine with silicon (in the form of dangling bonds with carbon), forming Si—N bonds.

The present invention also produces a marked effect when it is applied to an active layer of silicon oxide film which has been crystallized by the aid of such elements as nickel, cobalt, iron, platinum, and palladium, which promote the crystallization of amorphous silicon film. Crystallization by such elements yields silicon film having very good crystallinity and a very high field effect mobility. Therefore, a gate insulating film is necessary that matches such properties. A gate insulating film that meets this requirement is obtained by the present invention. In addition, the present invention includes the annealing step which crystallizes the amorphous region remaining in the grain boundary. This contributes to the furtherance of crystallinity.

The annealing step of the present invention not only improves the characteristic properties of the gate insulating film but also relieves the strains induced in the silicon film by laser annealing.

When an extremely highly crystalline silicon film of monodomain structure is used, it is necessary that the gate insulating film have the same characteristic properties as the thermal oxidation film. This requirement is met by thermal oxidation film, CVD oxidation film, and PVD oxidation film which are treated according to the present invention.

Treatment by irradiation with ultraviolet rays in an atmosphere of nitrogen oxide, oxygen, or nitrogen is effective if it is carried out before the gate insulating film is formed. This treatment reduces charge trapping centers and charge density at the interface between the active layer and the gate insulating film. Irradiation with ultraviolet rays should preferably be accompanied by heating at 400°–700° C. The treatment which is carried out before the gate insulating film is formed may be regarded as the process of cleaning the surface of the active layer (island-like semiconductor region). The treatment that employs nitrogen oxide or oxygen may be regarded as the process for forming a thin oxide film on the surface simultaneously with cleaning. To maximize the effect of cleaning the surface of the active layer by the above treatment, it is important to keep the atmosphere clean until the subsequent step of forming the gate electrode. This treatment cleans the surface of the active layer and prevents the occurrence of recombination centers and unnecessary charges resulting from organic matters present on the surface of the active layer.

The atmosphere of nitrogen oxide, oxygen, or nitrogen may contain ammonia or hydrazine. The atmosphere may also be composed of two or more gases selected from nitrogen oxide, oxygen, or nitrogen. The treatment to be carried out before the gate insulating film is formed may be combined with the treatment (as disclosed herein) which is carried out after the gate insulating film has been formed. This produces a marked effect.

The present invention also provides a process of forming the gate insulating film from a crystalline silicon film by thermal oxidation at a maximum temperature of 700° C. or lower.

The present invention involves the heat treatment of a silicon film in a specific atmosphere. This heat treatment forms a thermal oxidation film on the surface of a silicon film at a low temperature of 400°–700° C., typically 550°–650° C. In the present invention, a silicon film undergoes thermal oxidation to form a silicon oxide film by heat annealing at 400°–700° C. in a highly reactive atmosphere containing atomic oxygen, ozone, or excited molecular oxygen or nitrogen oxide, which are generated by irradiating oxygen, ozone, or nitrogen oxide ($NO_x$: $0.5 \leq x \leq 2.5$) with ultraviolet rays. The oxygen nitride used for thermal oxidation in the present invention should preferably be any one of or a mixture of dinitrogen oxide ($N_2O$), nitrogen monoxide (NO), and nitrogen dioxide ($NO_2$).

The gas composed of highly reactive components as mentioned above is referred to as a reactive gas hereinafter, and it may also be referred to as reactive oxygen, reactive ozone, or reactive nitrogen oxide after the major component of the gas. In the present invention, the reactive oxygen or reactive nitrogen oxide may be composed of only oxygen or nitrogen oxide, respectively. It may also contain argon or any other inert gas.

Incidentally, the above atmosphere should not contain hydride such as water ($H_2O$), because it causes the resulting thermal oxidation film to contain hydrogen. Also it should not contain carbon oxide gas (CO and $CO_2$). The content of water and carbon oxide in the atmosphere should be 1 ppm or less, preferably 10 ppb or less.

The upper limit of the thermal oxidation temperature varies depending on the type of the substrate. The higher is the temperature, the more readily proceeds the oxidation reaction. An adequate temperature is 550°–650° C. for the Corning 7059 substrate, which is a typical glass substrate. The substrate used in the present invention includes those which have a strain point of 750° C. or lower, typically 550°–680° C., as represented by the Corning 7059 substrate, which is alkali-free borosilicate glass.

An example of the apparatus used to practice the present invention is shown in FIG. 1A. The apparatus consists of a first reaction chamber 1 (in which oxygen, ozone, or nitrogen oxide is made reactive by ultraviolet rays) and a second reaction chamber 2 (in which the reactive oxygen, ozone, or nitrogen oxide generated in the first reaction chamber is introduced and a silicon film is oxidized at 400°–700° C.). These reaction chambers and their connecting pipe should be kept at a proper temperature. The second reaction chamber 2 is provided with heaters 3, but the first reaction chamber 1 and the connecting pipe may also be provided with heaters, which are not shown in FIG. 1A.

The first reaction chamber should preferably be constructed such that oxygen, ozone, or oxygen nitride therein is irradiated with ultraviolet rays as effectively as possible to be made reactive. FIG. 1B is a schematic drawing of the first reaction chamber. There is shown a winding pipe 6 (preferably of synthetic quartz) transparent to ultraviolet rays, into which oxygen, ozone, or nitrogen oxide is introduced. Sources of ultraviolet rays (such as low-pressure mercury lamp) are arranged adjacent to the winding pipe. FIG. 1C is a sectional view taken along the broken line in FIG. 1B. It is to be noted that low pressure mercury lamps 7 are arranged between the pipes 6. The first reaction chamber should be kept at a room temperature, preferably at 400°–700° C. In addition, the temperature of the first reaction chamber should be the same as that of the second reaction chamber so as to ensure the uniform temperature distribution in the second reaction chamber.

If the connecting pipe between the first and second reaction chambers is at a low temperature, the gas molecules excited in the first reaction chamber return to their ground state, which decreases the reactivity. Therefore, in order to maintain a desired reactivity, it is desirable to keep the connecting pipe at an adequate temperature. In addition, it is desirable that the inner wall of the connecting pipe be lined with a quartz-based material to protect it from attack by reactive gas molecules. A preferred example of such a material is high-purity quartz composed of more than 90 mol % of silicon oxide.

If the inner wall is made of a metallic material, the excited molecules and atoms recombine to become stable. The inner wall of quartz does not cause such troubles; it keeps many atoms and molecules active even at a distance 50–100 cm away from the first reaction chamber.

The second reaction chamber 2 is provided with susceptors 4 to hold a large number of substrates 5. This permits the treatment of a large number of substrates at one time. It is desirable that the pressure of the atmosphere in the second reaction chamber be kept lower than atmospheric pressure.

The rate of oxidation may be effectively increased by pressurizing the atmosphere in 1 to 15 atm. For example, oxidation at 10 atm proceeds 10 times as fast as that at 1 atm. In addition, increased pressure permits oxidation at lower temperatures.

FIG. 14 shows the relationship between the time of thermal oxidation and the thickness of the thermal oxidation film obtained by using the apparatus shown in FIG. 1A. The atmosphere for oxidation is dinitrogen oxide. The higher the temperature and pressure, the more readily proceeds the oxidation reaction.

In the present invention, crystalline silicon (as the active layer) is formed from amorphous silicon film obtained by plasma CVD or low pressure CVD. There are two major methods for crystallization. The first method involves annealing for crystallization which is carried out for a proper time at 500°–650° C. after the amorphous silicon film has been formed. The crystallization of amorphous silicon may be accelerated by addition of specific elements, such as nickel, iron, platinum, palladium, and cobalt. These elements lower the crystallization temperature and shorten the crystallization time. They should be used in an amount sufficient for crystallization but small enough not to adversely affect the characteristics of silicon semiconductor. The preferred amount is such that the minimum concentration in silicon film determined by secondary ion mass spectroscopy (SIMS) is $1 \times 10^{15}$ to $3 \times 10^{19}$ atoms/cm$^3$. The elements to accelerate crystallization varies in distribution depending on how the silicon film is treated, and the minimum value may be obtained at the interface or near the center of the film.

The second method is the so-called laser annealing which performs crystallization by irradiating the amorphous silicon film with an intense light such as laser. The selection of the first and second methods depends on the characteristics of TFT required, the apparatus available, and the amount of investment.

It is also possible to use the first and second methods in combination. For example, crystallization by heat annealing may be followed by laser annealing which enhances the crystallinity. This is effective in the case where heat annealing is carried out in the presence of nickel or any other elements which accelerate crystallization. In this case, some portions remain amorphous in the grain boundary, and they are effectively crystallized by laser annealing. Conversely, it is also possible to perform heat annealing on the silicon film which has been crystallized by laser annealing, so that the silicon film is relieved from strain caused by laser annealing.

The thermal oxidation film obtained by the present invention may be used as such as the gate insulating film. For improvement of its characteristic properties, it is desirable to expose the resulting thermal oxidation film to heat annealing at 400°–700° C. in an atmosphere of hydrogen nitride such as ammonia ($NH_3$) and hydrazine ($N_2H_4$). This heat annealing yields a silicon oxide nitride film which is electrically stable, with dangling bonds completely eliminated by nitrogen and with oxygen partly replaced by nitrogen.

In the case where the thermal oxidation film (to be used as the gate insulating film) is not sufficiently thick, it is possible to superpose thereon an insulating film composed mainly of silicon oxide formed by PVD or CVD. The resulting insulating film of multilayer structure may be used as the gate insulating film. An insulating film formed by PVD or CVD is by far inferior in characteristic properties to a thermal oxidation film; however, this disadvantage is eliminated without any adverse effect on the characteristics of TFT, if the surface of the active layer is covered with a thermal oxidation film having a thickness of 200 Å or more.

The insulating film may be formed by PVD (typified by sputtering) or CVD (typified by plasma CVD, low pressure CVD, and atmospheric pressure CVD). Other processes may also be employed. It is possible to perform plasma CVD or low pressure CVD by using TEOS as the raw material. If a silicon oxide film is to be deposited from TEOS and oxygen by plasma CVD, it is desirable that the substrate be kept at 200°–500° C. Low pressure CVD with TEOS and ozone proceeds at a comparatively low temperature (say, 375±20° C.), giving rise to a silicon oxide film free of plasma-induced damage.

In the similar fashion, it is possible to form a silicon oxide film free of plasma-induced damage by low pressure CVD which employs as raw materials monosilane ($SiH_4$) and oxygen ($O_2$) or monosilane and nitrogen oxide (such as dinitrogen oxide). The combination of monosilane and nitrogen oxide may be used for plasma CVD. Of several processes of plasma CVD, ECR-CVD is desirable which performs discharge under the condition of ECR (electron cyclotron resonance). It yields a satisfactory gate insulating film because it causes less damage due to plasma.

The present inventors found that an insulating film composed mainly of somewhat hard silicon oxide is adequate as the gate insulating film of TFT. A typical example is a silicon oxide film formed by etching with buffered hydrofluoric acid (a 1:50:50 mixture of hydrofluoric acid, ammonium fluoride, and acetic acid) at 23° C. at an etching rate of 1000 Å/min or lower, preferably 300–800 Å/min. The requirement for this etching rate is met by a silicon oxide film containing nitrogen in a concentration of $1\times10^{17}$ to $1\times10^{21}$ atoms/cm$^3$ on average.

The insulating film superposed on the thermal oxidation film should preferably undergo heat annealing at 300°–700° C. in an atmosphere of dinitrogen oxide for improvement of its characteristic properties. The effect of heat annealing will be enhanced or the desired effect of heat annealing will be obtained even at lower temperatures, if the insulating film is irradiated with ultraviolet rays. This is because ultraviolet rays activates dinitrogen oxide, making it more reactive to the insulating film deposited by CVD or PVD.

Likewise, it is also possible to treat the insulating film with a plasma in an atmosphere containing dinitrogen oxide. In this case, the plasma excites and activates dinitrogen oxide, making it reactive to the insulating film. Treatment with a plasma requires that the pressure of dinitrogen oxide be low for plasma generation. For the reaction to be complete, the treatment in plasma may be followed by heat annealing at 400°–700° C. in an atmosphere of dinitrogen oxide at 0.1 atm or higher.

For the oxidation reaction of silicon to proceed, it is necessary that the atmosphere contain oxidizing atomic oxygen or equally reactive oxidizing molecules. However, an extremely high temperature is required to convert molecular oxygen into atomic oxygen, and hence thermal oxidation in a dry oxygen atmosphere proceeds only at high temperatures of 1000° C. or higher.

The present invention is based on the finding that atomic oxygen and ozone (which are obtained by irradiating oxygen with ultraviolet rays for excitation, decomposition, and reaction) or excited oxygen molecules and nitrogen oxide molecules have a sufficiently long life and are capable of spatial movement under adequate conditions. That is, the present invention employs oxygen, ozone, or nitrogen oxide, which has been made reactive by irradiation with ultraviolet rays, for thermal oxidation in a low-temperature reaction chamber into which it is introduced. Therefore, the process of the present invention permits thermal oxidation to proceed at a lower temperature as compared with the conventional process.

A silicon film crystallized by heat annealing according to the present invention produces the following effect. In general, the gate insulating film and active layer should be as thin as possible, so that they have good characteristic properties, e.g., high mobility and low off-state current. On the other hand, an amorphous silicon film is readily crystallized in proportion to its thickness. This implies that the thickness of the active layer presents a contradictory effect on characteristic properties and processing properties. This contradiction was resolved in the following manner by the present invention for the first time. That is, an amorphous silicon film is formed thick before crystallization. This silicon film is capable of complete crystallization. The crystallized silicon film then undergoes thermal oxidation to be made thin. This step is intended to improve the characteristic properties of TFT. This thermal oxidation readily oxidizes the amorphous parts and crystal grain boundaries where recombination centers tend to exist, with the result that the number of recombination centers in the active layer is reduced. This leads to an increase in yields.

The present invention produces a marked effect when applied to an active layer of a crystalline silicon film which has been crystallized by the aid of such elements as nickel, cobalt, iron, platinum, and palladium, which promote the crystallization of amorphous silicon film. Crystallization by such elements yields silicon film having exceptionally good crystallinity and a very high field effect mobility. Therefore, a gate insulating film is necessary that matches such properties. A gate insulating film that meets this requirement is obtained by the present invention. In addition, the present invention includes the thermal oxidation step which crystallizes the amorphous region remaining in the grain boundary. This contributes to the furtherance of crystallinity.

The thermal oxidation step of the present invention not only improves the characteristic properties of the gate insulating film but also relieves the strains induced in the silicon film by laser annealing.

In the case where an extremely highly crystalline silicon film of monodomain structure is used, it is necessary that the gate insulating film have the same characteristic properties as the thermal oxidation film. This requirement is met by the thermal oxidation film obtained by the present invention.

The present invention also provides a means to improve the characteristic properties of a silicon oxide film deposited by PVD or CVD.

According to the present invention, the object is achieved by forming a thermal oxidation film by oxidation of silicon film at 500°–700° C. or by forming a gate insulating film composed mainly of silicon oxide which is deposited by PVD or CVD so as to cover island-like crystalline silicon, and then by annealing the resulting film at 400°–700° C. in a highly reactive atmosphere containing nitrogen which is generated by excitation or decomposition by an adequately heated catalyst. This heat annealing modifies the silicon oxide film. The preferred gas used in the present invention include dinitrogen oxide ($N_2O$), nitrogen monoxide (NO), and nitrogen dioxide ($NO_2$), represented by the general formula of $NO_x$, where $0.5 \leq x \leq 2.5$. It also includes ammonia ($NH_3$) and hydrazine ($N_2H_4$), represented by the general formula of $NH_x$, where $1.5 \leq x \leq 3$.

The gas containing nitrogen oxide (or hydrogen nitride) excited or decomposed by a catalyst is referred to as reactive nitrogen oxide (or reactive hydrogen nitride) hereinafter. They may be composed of only nitrogen oxide or hydrogen nitride, but they may be incorporated with argon or any other inert gas. Heat annealing in an atmosphere of reactive nitrogen oxide or reactive hydrogen nitride improves the characteristic properties of a silicon oxide film, especially those of the interface with a silicon film. The above-mentioned atmosphere should not contain water ($H_2O$) and carbon oxide (CO, $CO_2$). Their content should be less than 1 ppm, preferably less than 1 ppb.

The above-mentioned heat annealing in reactive nitrogen oxide or reactive hydrogen nitride may be preceded or followed by heat annealing in an atmosphere of ordinary hydrogen nitride or nitrogen oxide (containing a limited amount of excited molecules or active species), hydrogen, oxide, ozone, etc. Also, the heat annealing in reactive nitrogen oxide may be followed by heat annealing in reactive hydrogen nitride. This order may be reversed. Heat annealing in reactive nitrogen oxide alone or reactive hydrogen nitride alone is also satisfactory.

FIG. 16A shows an example of the apparatus used in the present invention. To practice the present invention, a catalyst is required which excites or decomposes hydrogen nitride or nitrogen oxide. In FIG. 16A, there is shown a heat annealing furnace 81 which holds therein a reticulate catalyst 85. Preferred examples of the catalyst include 3d transition metals (such as platinum, palladium, reduced nickel, cobalt, titanium, vanadium, and tantalum), which are used alone or in combination with alumina or silica.

The heat annealing furnace 81 is provided therein with susceptors 83. On each susceptor 83 are placed many substrates 84 which are treated at one time. The heat annealing furnace 81 is heated by heaters 82. Special attention should be paid to the temperature distribution in the heat annealing furnace so as to ensure the uniform treatment of many substrates. In addition, the pressure in the heat annealing furnace should be lower than atmospheric pressure.

According to the present invention, the lowest and highest temperatures in the heat annealing furnace 81 are determined respectively by the reaction rate and the substance (such as substrate) which undergoes heat treatment. The adequate temperature in the heat annealing furnace should be 400°–700° C., preferably 450°–650° C. The higher is the temperature in the heat annealing furnace, the more readily proceeds the reaction. However, at high temperatures, glass substrates are likely to suffer heat shrinkage. This holds true especially at 650°–750° C. Heat shrinkage poses a problem with the formation of fine patterns. Therefore, the heat treatment of glass substrates should preferably be carried at a temperature lower than their strain point.

In the above-mentioned case, the catalyst is used by heating at the same temperature as the heat annealing furnace. In other words, if the temperature of the heat annealing furnace 81 is 700° C., then the temperature of the catalyst should also be 700° C. This temperature, however, may degrade the catalysts of the above-mentioned 3d transition metals, whose preferred temperature is 200°–600° C. In order to prevent the catalyst from degradation by keeping it at a low temperature, the reaction chamber 96 (in which hydrogen nitride or nitrogen oxide is excited or decomposed by the catalyst) should be positioned away from the heat annealing furnace 91 and they should be connected by the pipe 98, as shown in FIG. 16B. In this case, the heat annealing furnace 91 is heated by the heater 92 and the reaction chamber 96 is heated by the heater 97. This design permits the catalyst reaction chamber to be kept at a low temperature of 200°–400° C. In this example, the catalyst 95 is of reticulate ones.

The above structure is desirable because the reactivity can be maintained for a long time over a long distance especially when use is made of hydrogen nitride or nitrogen oxide which has been diluted with an inert gas such as argon. Under adequate conditions, the reactivity can be maintained for 0.1–10 seconds. Hence, the distance between the catalyst reaction chamber 96 and the heat annealing furnace 91 can be as long as 0.1–1 meter.

If the temperature of the pipe 98 connecting the heat annealing furnace 91 and the catalyst reaction chamber 96 is extremely low, the gas molecules excited in the reaction chamber 96 return to the ground state, thereby losing their reactivity. Therefore, in order to maintain the reactivity, it is desirable to provide the pipe 98 with the heater 99 for an adequate temperature. The temperature of the pipe 98 should preferably be intermediate between those of the heat annealing furnace 91 and the reaction chamber 96.

In addition, it is desirable that the inner wall of the pipe 98 be lined with a quartz-based material to protect it from attack by reactive gas molecules. A preferred example of such a material is high-purity quartz composed of 90 mol % or more of silicon oxide.

If the inner wall is made of a metallic material, the excited molecules return to the ground state or recombine to become stable, thereby losing reactivity. The inner wall of quartz does not cause such troubles; it keeps many atoms and molecules active even at a distance 50–100 cm away from the catalyst reaction chamber.

The heat annealing furnace 91 is provided with susceptors 93 on which many substrates 94 are placed and treated at one time, in the same manner as shown in FIG. 16A.

In the above example, the catalyst is of reticular ones; however, it may be of powdery ones or granular ones if it is held in an adequate container.

In the present invention, the gate insulating film may be formed by PVD (typified by sputtering) or CVD (typified by plasma CVD, low pressure CVD, and atmospheric pressure CVD). Other processes may also be employed. It is possible to run plasma CVD or low pressure CVD by using TEOS as the raw material. If a silicon oxide film is to be deposited from TEOS and oxygen by plasma CVD, it is desirable that the substrate be kept at 200°–500° C. Low pressure CVD with TEOS and ozone proceeds at a comparatively low temperature (say, 375±20° C.), giving rise to a silicon oxide film.

In the similar fashion, it is possible to form a silicon oxide film free of plasma damage by low pressure CVD which employs as raw materials monosilane ($SiH_4$) and oxygen ($O_2$) or monosilane and nitrogen oxide (such as dinitrogen oxide). The combination of monosilane and nitrogen oxide may be used for plasma CVD. Of several processes of plasma CVD, ECR-CVD is desirable which performs discharge under the condition of ECR (electron cyclotron resonance). It yields a satisfactory gate insulating film because it causes less damage due to plasma.

The present inventors found that an insulating film composed mainly of somewhat hard silicon oxide is adequate as the gate insulating film of TFT. A typical example is a silicon oxide film formed by etching with buffered hydrofluoric acid (a 1:50:50 mixture of hydrofluoric acid, ammonium fluoride, and acetic acid) at 23° C. at an etching rate of 1000 Å/min or lower, typically 300–800 Å/min. The requirement for this etching rate is met by a silicon oxide film containing nitrogen in an amount of $1\times10^{17}$ to $1\times10^{21}$ atoms/cm$^3$ on average.

According to the present invention, the crystalline silicon to become the active layer is formed by using as the starting material the amorphous silicon film which is obtained by plasma CVD or low pressure CVD. There are two major methods for crystallization. The first method involves heat annealing for crystallization which is carried out for a proper length of time at 500°–650° C. after the amorphous silicon film has been formed. The crystallization of amorphous silicon may be accelerated by addition of specific elements, such as nickel, iron, platinum, palladium, and cobalt. These elements lower the crystallization temperature and shorten the crystallization time. They should be used in an amount sufficient for crystallization but small enough not to adversely affect the characteristics of silicon semiconductor. The preferred amount is such that the minimum concentration in silicon film determined by secondary ion mass spectroscopy (SIMS) is $1\times10^{15}$ to $3\times10^{19}$ atoms/cm$^3$. The elements to accelerate crystallization varies in distribution depending on how the silicon film is treated, and the minimum value may be obtained at the interface or near the center of the film.

The second method is the so-called laser annealing which performs crystallization by irradiating the amorphous silicon film with an intense light such as laser. The selection of the first and second methods depends on the characteristics of TFT required, the apparatus available, and the amount of investment.

It is also possible to use the first and second methods in combination. For example, crystallization by heat annealing may be followed by laser annealing which enhances the crystallinity. This is effective in the case where heat annealing is carried out in the presence of nickel or any other elements which accelerate crystallization. In this case, some portions remain amorphous in the grain boundary, and they are effectively crystallized by laser annealing. Conversely, it is also possible to perform heat annealing on the silicon film which has been crystallized by laser annealing, so that the silicon film is relieved from strain caused by laser annealing.

Thermal oxidation film formed by oxidation at low temperatures (say, 500°–700° C.) or silicon oxide film formed by CVD or PVD contains a large number of silicon dangling bonds, Si—H bonds, and Si—OH bonds. When the silicon oxide film is treated at high temperatures above 800° C. in an atmosphere of dinitrogen oxide, the Si—H bonds in silicon oxide are nitrided or oxidized into Si≡N, $Si_2$=N—O bonds, Si—N=O bonds, etc. The Si—OH bonds also undergo the same reaction. This reaction readily proceeds at the interface between silicon oxide and silicon, with the result that nitrogen concentrates at the silicon oxide-silicon interface. The amount of nitrogen at the interface is more than ten times the average amount in the silicon oxide film. Silicon oxide containing 0.1–10 atom % of nitrogen, typically 1–5 atom % of nitrogen, is desirable for the gate insulating film.

This reaction, however, does not proceed at low temperatures below 750° C., because dinitrogen oxide does not decompose at such low temperatures and hence there occur no active atoms and molecules which penetrate into the silicon oxide film. That is, the reaction is restricted by the decomposition of dinitrogen oxide. The same applies to other nitrogen oxides (such as nitrogen monoxide and nitrogen dioxide), although they vary in their optimum temperature. That is, it is impossible to improve the silicon oxide film and the interface between the silicon oxide film and the active layer at 400°–700° C., preferably 450°–650° C., as intended in the present invention.

By contrast, it is possible to bring about the above reaction if a reactive nitrogen oxide is used which contains, owing to the adequately heated catalyst, active atoms and molecules which penetrate into the silicon oxide film even at low temperatures of 700° C. or lower. The thus activated atoms and molecules are extremely limited in their life. Therefore, they are not of practical use even though the catalyst is placed in the same furnace as shown in FIG. 16A. Under adequate conditions, however, they have a sufficiently long life and effectively act on substrates placed away from the catalyst.

Based on the foregoing, it is possible to separate the reaction chamber (in which the catalytic reaction takes place) and the reaction chamber (in which the treatment of gate insulating film is carried out). In an atmosphere diluted with argon or any other inert gas, reactivity is maintained for an extremely long period of time. Heat annealing in the present invention needs 400°–700° C.; this temperature is not for the decomposition of nitrogen oxide but for the penetration of activated atoms and molecules into the silicon oxide film.

Similar phenomena also take place in the atmosphere of hydrogen nitride such as ammonia and hydrazine. For example, the annealing of a silicon oxide film deposited by CVD or PVD in an atmosphere of ammonia at high temperatures of 850° C. or higher nitrides silicon dangling bonds, Si—H bonds, and Si—OH bonds to change them into Si≡N bonds. This reaction does not proceed at 650° C. or lower, because it involves the decomposition of ammonia and requires high temperatures of 850° C. or higher to yield active nitrogen atoms. It follows, therefore, that the nitriding reaction will proceed even at low temperatures of 400°–700° C. if ammonia is previously made reactive.

Incidentally, the treatment with hydrogen nitride nitrides Si—H bonds and Si≡O bonds into Si—N=$H_2$. This reaction takes place even when the hydrogen nitride is not reactive. Such bonds are converted into extremely stable Si≡N bonds and Si—N=O bonds by annealing in an atmosphere of dinitrogen oxide.

In the present invention, the reaction to the gate insulating film varies depending on whether hydrogen nitride is used or nitrogen oxide is used. This will be explained with reference to FIG. 21. FIG. 21A shows the results of determination by secondary ion mass spectroscopy (SIMS) of the nitrogen concentration in silicon oxide film deposited by sputtering on the active layer of crystalline silicon. The values are valid for only the part of silicon oxide (gate insulating film), and the nitrogen content is $1 \times 10^{18}$ atoms/cm$^3$. It is noted that the nitrogen content peaks in the vicinity of the interface between the active layer and the gate insulating film. This is due to the discontinuity of material (or the matrix effect) and does not mean that the nitrogen concentration actually increases at the interface.

It is annealed for 1 hour each in an atmosphere of nitrogen oxide and in an atmosphere of ammonia using the apparatus shown in FIG. 16A or FIG. 16B, with the substrate temperature kept at 600° C. Upon analysis by SIMS, the treated silicon oxide film gives the result indicated by b and c in FIG. 21. In the case of b (for treatment with dinitrogen oxide), the nitrogen content peaks at the interface as in the case of a, although the peak value in b is two orders of magnitude greater than that in a. This suggests the accumulation of nitrogen in the vicinity of the interface as well as the contribution of matrix effect.

In the case of c (for treatment with ammonia), the nitrogen content increases through the entire gate insulating film but does not concentrate at the interface. In other words, treatment with ammonia converts silicon oxide into silicon oxide nitride.

The present invention produces a marked effect when it is applied to a silicon oxide film formed by sputtering, especially one which contains less oxygen than the stoichiometric amount. In other words, annealing in an atmosphere of reactive nitrogen oxide makes up for the deficiency of oxygen in such a silicon oxide film, with its composition approaching the stoichiometric one. In a similar fashion, annealing in an atmosphere of reactive hydrogen nitride causes nitrogen to enter the site where oxygen should be, resulting in a silicone oxide nitride film which is electrically stable.

The above-foregoing suggests that the forming of silicon oxide film by sputtering is not disadvantageous. The conventional procedure for sputtering to form silicon oxide film has to be carried out in a limited atmosphere so that the resulting film has as stoichiometric a composition as possible. For example, an atmosphere composed of oxygen and argon must meet the requirement that the ratio of oxygen to argon be greater than one, with pure oxygen being preferable to a mixture. Such an atmosphere is not suitable for mass production because of low film forming rate. Reactive oxygen poses another problem with oxidation of the vacuum apparatus and chambers.

According to the present invention, it is possible to convert a silicon oxide film into one which is suitable for use as the gate insulating film even though it does not have a stoichiometric composition. This means that according to the present invention, it is possible to form a silicon oxide film advantageously (in terms of film forming rate) even in an atmosphere composed of oxygen and argon whose ratio is equal to one or smaller than one. In an extreme case, an atmosphere of pure argon can be used to form a silicon oxide film rapidly and stably.

The present invention produces a marked effect when it is applied to a silicon oxide film formed by plasma CVD or low pressure CVD which, employs a carbon-containing silicon source such as TEOS. The disadvantage of using TEOS in the conventional process is that the resulting silicon oxide film contains a large amount of carbon, with carbon near the interface with silicon film impairing the characteristic properties of TFT. According to the present invention, it is possible to lower the carbon content in the film by annealing in an atmosphere of reactive nitrogen oxide. The annealing promotes oxidation of carbon, producing carbon oxide which is released.

This process will be explained with reference to FIG. 20. (In this example,.dinitrogen oxide is used as nitrogen oxide.) Reactive dinitrogen oxide is rich in atomic nitrogen and oxygen which easily penetrate into a silicon oxide film to combine with carbon (in the form Si—C bonds) therein, forming chemically stable carbon dioxide gas which is released, and to combine with silicon (in the form of dangling bonds with carbon), forming Si—N bonds.

The present invention also produces a marked effect when it is applied to an active layer of silicon oxide film which has been crystallized by the aid of such elements as nickel, cobalt, iron, platinum, and palladium, which promote the crystallization of amorphous silicon film. Crystallization by such elements yields silicon film having very good crystallinity and a very high field effect mobility. Therefore, a gate insulating film is necessary that matches such properties. A gate insulating film that meets this requirement is obtained by the present invention. In addition, the present invention includes the annealing step which crystallizes the amorphous region remaining in the grain boundary. This contributes to the furtherance of crystallinity.

The annealing step of the present invention not only improves the characteristic properties of the gate insulating film but also relieves the strains induced in the silicon film by laser annealing.

In the case where an extremely highly crystalline silicon film of monodomain structure is used, it is necessary that the gate insulating film have the same characteristic properties as the thermal oxidation film. This requirement is met by thermal oxidation film, CVD oxidation film, and PVD oxidation film which are treated according to the present invention.

BRIEF DESCRIPTION OF THE DRAWINGS

FIGS. 2A to 2E show the steps in Example 1.

FIGS. 3A to 3F show the steps in Example 2.

DESCRIPTION OF THE PREFERRED EMBODIMENTS

EXAMPLE 1

Figure 1A:
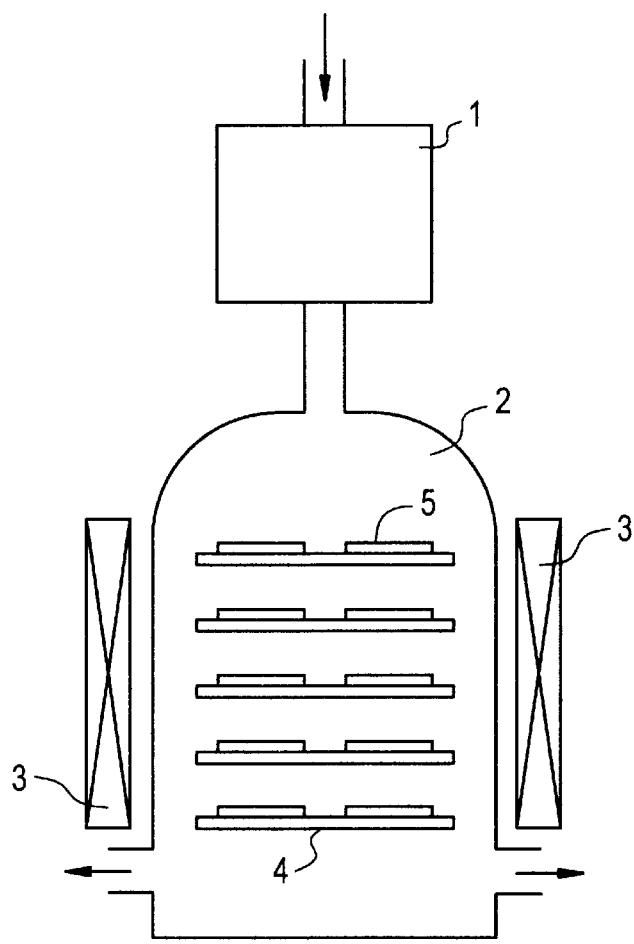
FIGS. 1A to 1C are schematic representations of an apparatus according to an embodiment of the present invention.

This example is shown in FIGS. 2A to 2E. In this example, a silicon oxide film formed by sputtering is used as the gate insulating film and an N-channel thin film transistor (TFT) is formed by heat annealing conforming to the present invention.

On a substrate 11 (Corning 7059, 100×100 mm) is formed by sputtering a silicon oxide film (1000–3000 Å thick, typically 2000 Å thick) which functions as a base oxide film 12, which excludes contamination from the substrate. The silicon oxide film undergoes heat annealing at 640° C. for 4 hours in an atmosphere of oxygen or dinitrogen oxide. This heat annealing is intended to stabilize the surface state.

On the silicon oxide film is formed by plasma CVD an amorphous silicon film (100–1500 Å thick, typically 500 Å thick), which is subsequently annealed to be made into a crystalline silicon film 13. This annealing employs a slight amount of elements (such as nickel, iron, platinum, palladium, and cobalt) which promote crystallization. In this example, a solution of nickel acetate is dropped on the amorphous silicon film, followed by spin coating to make an extremely thin film. For crystallization, nickel is introduced into the amorphous silicon film by heat annealing at 550° C. for 4 hours in an atmosphere of nitrogen. To improve the crystallinity of the resulting crystalline silicon film, the foregoing step may be followed by laser annealing. (FIG. 2A)

The crystalline silicon film 13 undergoes etching to form an island-like silicon film 14 which is an active layer of TFT. The island-like film 14 and its surrounding area are covered with a silicon oxide film (200–1500 Å thick, typically 1000 Å thick) which is formed by sputtering in an atmosphere of oxygen. This silicon oxide film functions as the gate insulating film 15. In this example, the sputtering employs a target of synthetic quartz. The sputter gas may be argon. The pressure of the sputter gas is 1 Pa, the electric power applied is 350 W, and the temperature of the substrate is 200° C.

The gate insulating film 15 undergoes annealing as specified in the present invention. This annealing is intended to improve the characteristics of the interface between the gate insulating film and the active layer. In this example, the annealing is carried out in an atmosphere of dinitrogen oxide by using the apparatus shown in FIG. 1A. The first reaction chamber 1 and the second reaction chamber 2 should be kept at 500°–650° C., typically 550° C., in this example. The pipe between the two chambers should also be kept at 550° C.

The pressure of each reaction chamber should preferably be 0.5–1.1 atm, typically 1 atm in this example. A lower pressure than this may also be acceptable. The chamber is supplied with dinitrogen oxide at a flow rate of 5 liter/minute. The heat annealing lasts for 0.5–6 hours, typically 1 hour. The first reaction chamber 1 is equipped with low pressure mercury lamps as the source of ultraviolet rays having a center wavelength of 246 nm. As the result of this treatment, the amount of hydrogen at the interface between the silicon oxide film and the silicon film is reduced by nitriding or oxidation and conversely the content of nitrogen at the interface is increased. (FIG. 2B)

A film (3000 Å-2 μm thick, typically 5000 Å thick) is formed by sputtering from aluminum (containing 1 wt % of Si or 0.1–0.3 wt % of Sc). A gate electrode 16 is formed from this aluminum film by patterning. The substrate is dipped in a solution of ethylene glycol containing 1–3% tartaric acid (adjusted to approximately pH 7 with ammonia) and anodized, with the aluminum gate electrode 16 being an anode and platinum being a cathode. The anodization is carried out such that the voltage is increased to 140 V at a constant current and this state is maintained for 1 hour. In this way an anodized film (about 2000 Å thick) is formed. (FIG. 2C).

Subsequently, the island-like silicon film 14 is implanted with phosphorus (as an impurity) by ion doping using the self-alignment technique which employs the gate electrode 16 as a mask. The dose is $1 \times 10^{14}$–$8 \times 10^{15}$ atoms/cm$^2$, and the accelerating voltage is 50–90 kV. In this example, the dose is $1 \times 10^{15}$ atoms/cm$^2$ and the accelerating voltage is 80 kV. In this way there is formed the N-type impurity region (source/drain region) 17. (FIG. 2D)

The doped impurity region is activated by irradiation with a laser beam (KrF excimer laser, having a wavelength of 248 nm, a pulse width of 20 ns, and an energy density of 200–400 mJ/cm$^2$, typically 250 mJ/cm$^2$).

The entire surface is covered with a silicon oxide film, 3000 Å thick, as the interlayer insulating film 18, which is formed by plasma CVD. The interlayer insulating film 18 and the gate insulating film 15 undergo etching so that contact holes are formed in the source/drain region 17. An aluminum film, 5000 Å thick, is formed by sputtering, and it is etched to form the source/drain electrodes 19, 20. In this way there is obtained an N-channel type TFT. (FIG. 2E)

The thus obtained TFT exhibits good characteristic properties with a minimum of degradation, because its gate insulating film has a good voltage resistance. TFT is tested for the degradation of its characteristic properties by varying the gate voltage in −17 V to +17 V, with the drain voltage fixed at +14 V. The ratio of degradation is defined by $1-(\mu_{10}/\mu_0)$, where $\mu_0$ is the field effect mobility measured initially and $\mu_{10}$ is the field effect mobility measured after voltage application. In the case of TFT obtained in the present invention, the ratio of degradation defined as above is 1.3%.

For the purpose of comparison, the same procedure as above is repeated except that the gate insulating film is annealed at 550° C. for 3 hours in an atmosphere of nitrogen (in place of dinitrogen oxide). In this case the ratio of degradation is 52.3%.

EXAMPLE 2

This example is shown in FIGS. 3A to 3F. In this example, a silicon oxide film deposited by plasma CVD (which employs TEOS and oxygen as the raw material gases) is used as the gate insulating film and a CMOS type TFT is formed by heat annealing conforming to the present invention.

On a substrate 21 (NA35 made by NH Technoglass, 100×100 mm) is formed by sputtering a silicon oxide film (2000 Å thick) which functions as a base oxide film 22, which excludes contamination from the substrate. An amorphous silicon film (500 Å thick) is formed by plasma CVD. A solution of nickel acetate is applied by spin coating in the same manner as in Example 1. For crystallization, the amorphous silicon film undergoes heat annealing at 500° C. for 4 hours in an atmosphere of nitrogen.

For the improvement of crystallinity, the crystalline silicon film undergoes laser annealing by KrF excimer laser (having a wavelength of 248 nm and an energy density of 250–350 mJ/cm$^2$, typically 300 mJ/cm$^2$). In this way there is obtained the crystalline silicon film 23. It is composed of comparatively large crystal grains (up to 10 $\mu$m square) and has the monodomain structure in which the crystal orientation in the same direction ranges over the distance which is several times to ten-odd times the size of the crystal grain. (FIG. 3A)

The crystalline silicon film 23 undergoes etching to form an island-like silicon film 24, 25 which is the active layer of TFT. In this example, the active layers are formed randomly, but many of them are found to be such that the region in which the channel of TFT is formed is of monodomain structure.

The island-like silicon film 24, 25 and its surrounding area are covered with a silicon oxide film (200–1500 Å thick, typically 1000 Å thick) which is formed by plasma CVD that employs TEOS and oxygen as raw material gases. The plasma CVD is carried out under the condition that the gas pressure is 4 Pa, the electric power is 150 W, and the substrate temperature is 350° C. This silicon oxide film functions as the gate insulating film 26.

The gate insulating film undergoes annealing as specified in the present invention. This annealing is intended to improve the characteristics of the gate insulating film, especially the interface between the gate insulating film and the active layer. In this example, the heat annealing is carried out such that the substrate is placed in the heat annealing apparatus as shown in FIG. 1A and is heated at 350° C. for 2 hours under a stream of hydrogen in the reaction chamber 2. This heat annealing introduces hydrogen into dangling bonds present in the silicon oxide film.

Then, the second reaction chamber is supplied with a 1:1 mixture of dinitrogen oxide and argon, and heat annealing is carried out at 600° C. for 1 hour under a pressure of 1 atm, with the flow rate of the reaction gas being 8 liter/minute.

The heat annealing reduces, by nitriding or oxidation, the amount of hydrogen in the silicon oxide film and in the interface of it and the silicon film. The heat annealing also reduces, by oxidation, the amount of carbon contained in the silicon oxide film formed from TEOS. Carbon is oxidized into carbon oxide which releases itself. In this way there is obtained the silicon oxide film suitable for the gate insulating film. (FIG. 3B)

Subsequently, a polycrystalline silicon film (6000 Å thick) is formed by low pressure CVD. It is made into the gate electrodes 27, 28 by patterning. The polycrystalline film is incorporated with a trace amount of phosphorus to improve its conductivity. (FIG. 3C)

Then, the island-like silicon film 24, 25 is implanted with impurities by ion doping using the self-alignment technique which employs the gate electrode 27, 28 as a mask. First, phosphorus is implanted such that the region in which the P-channel type TFT is formed is covered by the photoresist mask 29. In this way the N-type impurity region 30 (source/drain region) is formed. The dose is $1\times10^{14}$–$8\times10^{15}$ atoms/cm$^2$, and the accelerating voltage is 50–90 kV. In this example, the dose is $1\times10^{14}$ atoms/cm$^2$ and the accelerating voltage is 80 kV. (FIG. 3D)

Second, boron is implanted such that the region in which the N-channel type TFT is formed is covered by the photoresist mask 31. In this way the P-type impurity region 32 (source/drain region) is formed. The dose is $1\times10^{14}$–$8\times10^{15}$ atoms/cm$^2$, and the accelerating voltage is 40–80 kV. In this example, the dose is $1\times10^{15}$ atoms/cm$^2$ and the accelerating voltage is 65 kV. (FIG. 3E)

The doped impurity region 30, 32 is activated by irradiation with a laser beam (KrF excimer laser, having a wavelength of 248 nm, a pulse width of 20 ns, and an energy density of 200–400 mJ/cm$^2$, typically 250 mJ/cm$^2$).

The entire surface is covered with a silicon oxide film, 5000 Å thick, as the interlayer insulating film 33, which is formed by plasma CVD. The interlayer insulating film 33 and the gate insulating film 26 undergo etching so that contact holes are formed in the source/drain region 30, 32. An aluminum film, 5000 Å thick, is formed by sputtering, and it is etched to form the source/drain electrodes 34, 35, 36. In this way there is obtained a CMOS-type TFT. (FIG. 3F)

EXAMPLE 3

This example is shown in FIGS. 4A to 4F. In this example, a silicon oxide film is formed by ECR-CVD and is heat-annealed as specified in the present invention. The object of this example is to form a P-channel type TFT as the switching transistor (picture element TFT) for the active matrix circuit.

Figure 4A:
FIGS. 4A to 4F show the steps in Example 3.

On a substrate 41 (100×100 mm) is formed by low pressure CVD a silicon oxide film (3000 Å thick) which functions as a base oxide film 42. An amorphous silicon film (500 Å thick) is formed by plasma CVD. A solution of nickel acetate is applied by spin coating in the same manner as in Example 1. For crystallization, the amorphous silicon film undergoes heat annealing at 550° C. for 4 hours in an atmosphere of nitrogen. There is obtained the crystalline silicon film 43. For the improvement of crystallinity, the crystalline silicon film may undergo laser annealing. (FIG. 4A)

The crystalline silicon film 43 undergoes patterning to form an island-like silicon film 44 which is the active layer of TFT. The island-like silicon film and its surrounding area are covered with a silicon oxide film (1200 Å thick) as the gate insulating film, which is formed by ECR-CVD that employs monosilane (SiH$_4$) as the raw material gas and dinitrogen oxide as the oxidizing agent. The latter may be replaced by oxygen (O$_2$), nitrogen monoxide (NO), or nitrogen dioxide (NO$_2$). This step is carried out by using microwave (2.45 MHz, 400 W), with the substrate being not heated.

Incidentally, it is possible to form a silicon oxide film having the comparable characteristic properties by low pressure CVD (at 0.1–10 torr and 300°–500° C.) which employs the same raw material gas and oxidizing agent as mentioned above.

Figure 1B:
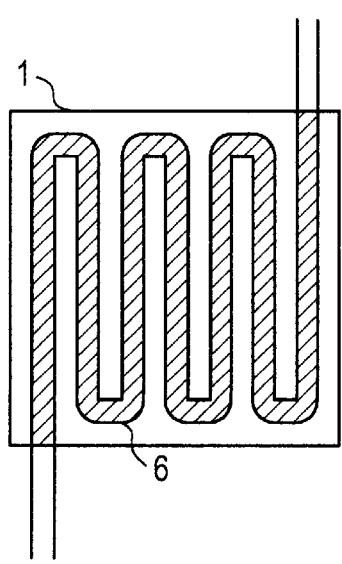
Figure 1C:
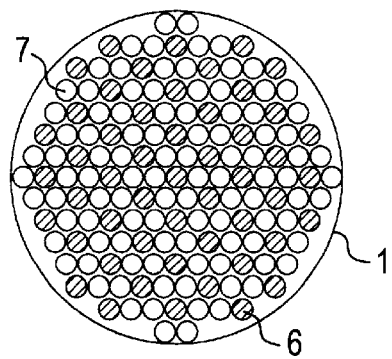
Figure 6A:
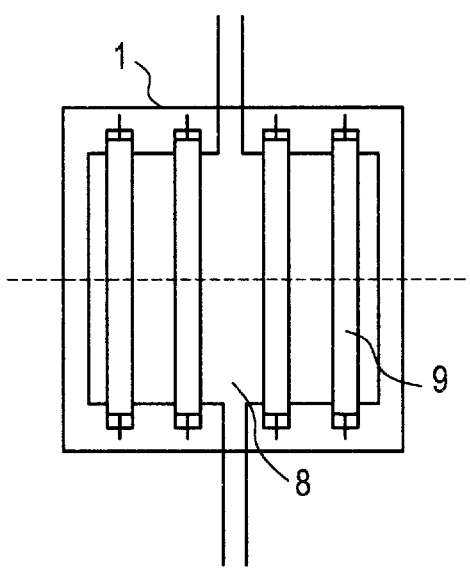
FIGS. 6A and 6B are schematic representations of another apparatus of the present invention.
Figure 6B:
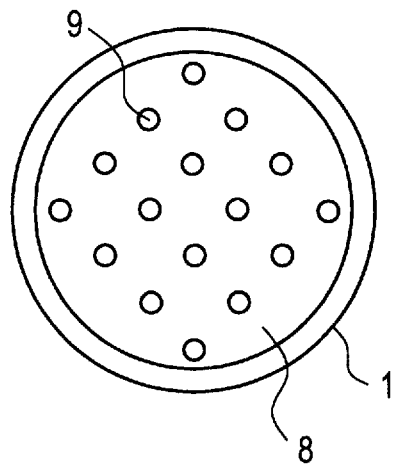
Figure 7:
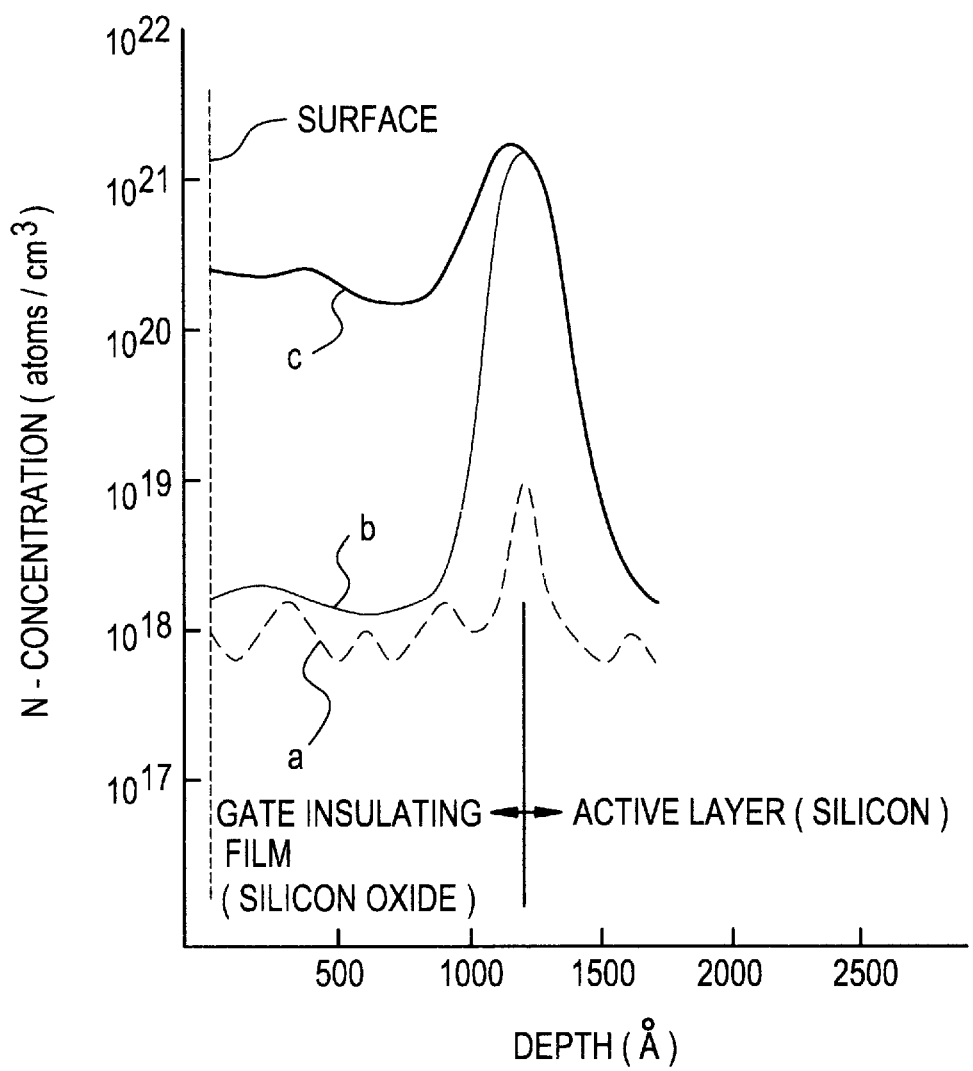
FIG. 7 is a diagram showing the nitrogen concentration in the silicon oxide film which has been treated according to the present invention.

To improve the characteristics of the gate insulating film, annealing is carried out using the reaction furnace as shown in FIG. 1A. The first reaction chamber 1 is constructed as shown in FIG. 6A (sectional view) and FIG. 6B (top view). Unlike the reaction chamber shown in FIG. 1B, it is not provided with thin tubes but is provided with UV sources 9 in the chamber 8 holding the reaction gas.

Figure 4B:
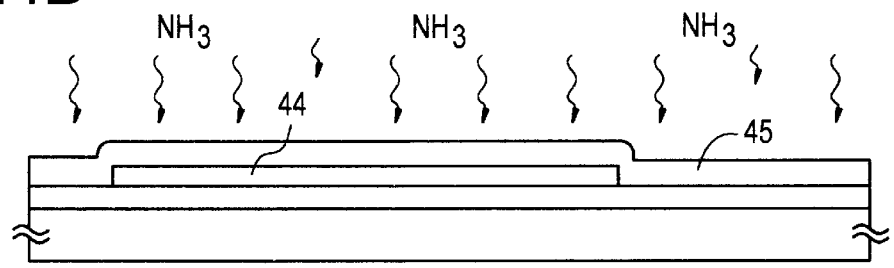

The heat annealing is carried out in an atmosphere of dinitrogen oxide, which is subsequently switched to ammonia. The temperature in the second reaction furnace (for both atmospheres) is 550° C. Dinitrogen oxide (which has passed through the first reaction chamber) is fed at a flow rate of 2 liter/minute for 1 hour, and, after switching, ammonia is fed at a flow rate of 2 liter/minute for 1 hour. In this way it is possible to nitride the silicon oxide film. (FIG. 4B)

Figure 4C:
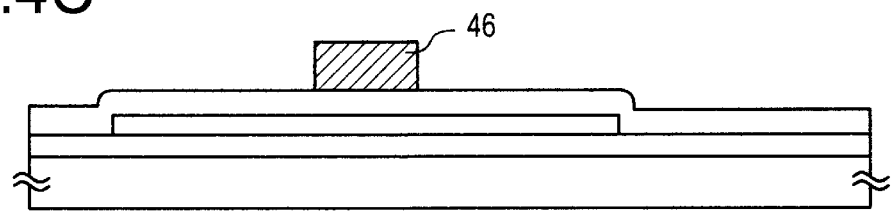

An aluminum film (6000 Å thick) is formed by sputtering. It is formed into the gate electrode 46 by patterning. It is incorporated with a trace amount (0.1–0.5 wt %) of scandium to prevent the growth of hillocks. (FIG. 4C)

Figure 4D:
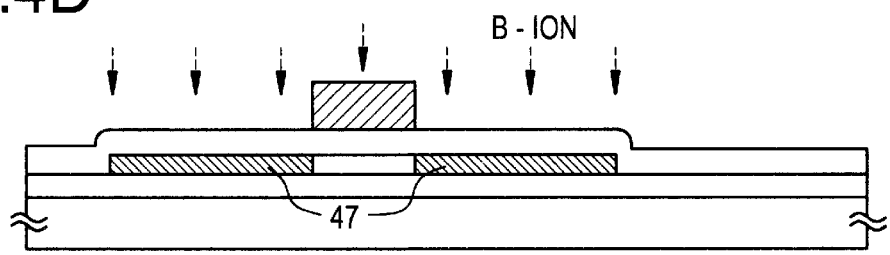

Then, the island-like silicon film 44 is implanted with boron as an impurity by ion doping using the self-alignment technique which employs the gate electrode 46 as a mask. The dose is $1 \times 10^{14}$–$8 \times 10^{15}$ atoms/cm$^2$ (typically $1 \times 10^{15}$ atoms/cm$^2$), and the accelerating voltage is 40–80 kV (typically 65 kV). In this way the P-type impurity region 47 (source/drain region) is formed. (FIG. 4D)

The doped impurity region 47 is activated by irradiation with a laser beam (KrF excimer laser, having a wavelength of 248 nm, a pulse width of 20 ns, and an energy density of 200–400 mJ/cm$^2$, typically 250 mJ/cm$^2$).

Figure 4E:
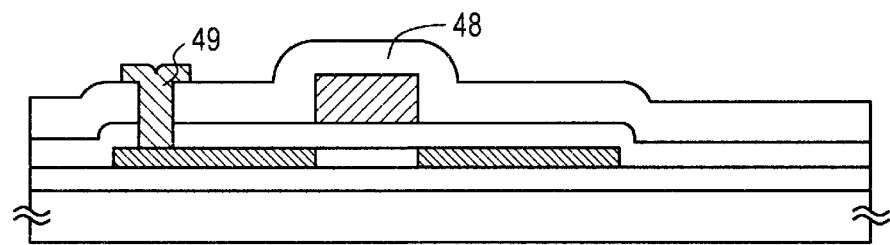

The entire surface is covered with a silicon oxide film, 3000 Å thick, as the interlayer insulating film 48, which is formed by plasma CVD. The interlayer insulating film 48 and the gate insulating film 45 undergo etching so that contact holes are formed in the source region. An aluminum film, 5000 Å thick, is formed by sputtering, and it is etched to form the source electrode 49. (FIG. 4E)

Figure 4F:
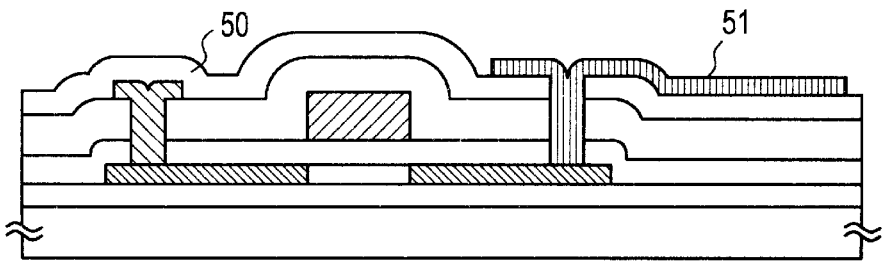
Figure 5:
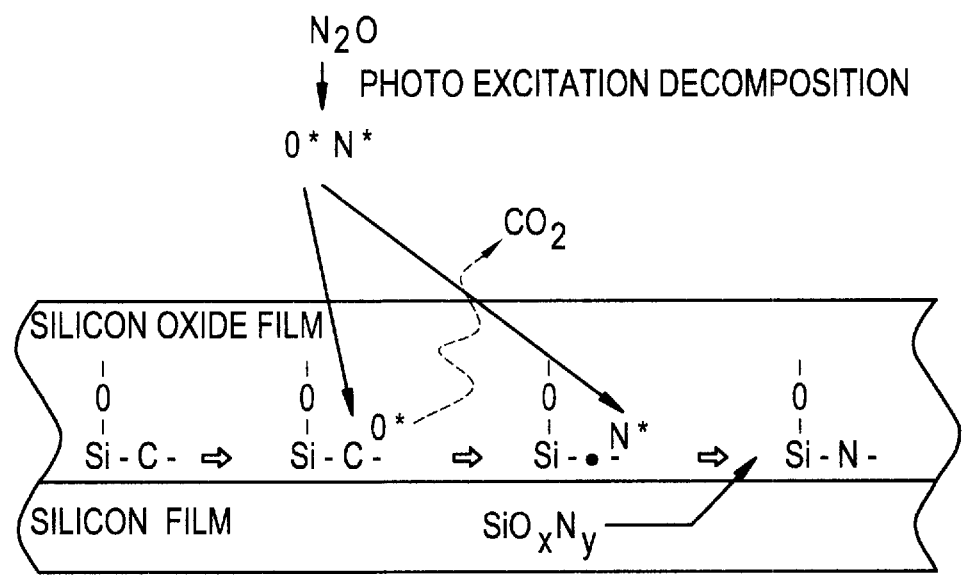
FIG. 5 is a diagram illustrating the effect of the present invention.

Subsequently, a silicon nitride film, 2000 Å thick, as the passivation film 50, is formed by plasma CVD. Etching is performed on the passivation film 50, the interlayer insulating film 48, and the gate insulating film 45 to form contact holes in the drain region. Finally, an ITO film is formed by sputtering and it is etched to form the picture element electrode 51. In this way there is obtained the desired picture element TFT. (FIG. 4F)

EXAMPLE 4

Figure 8A:
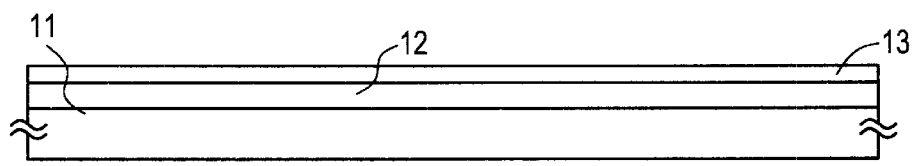
FIGS. 8A to 8E show the steps in Example 4.
Figure 8B:
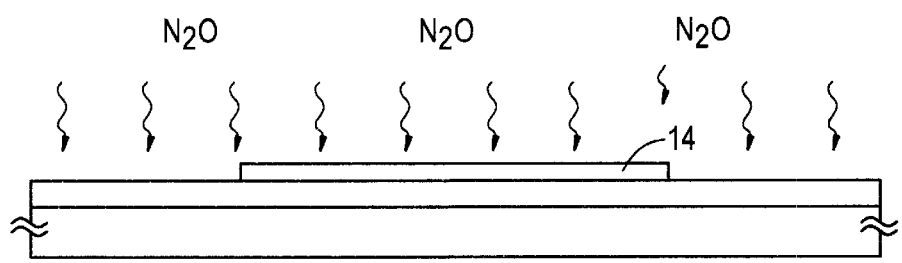

Steps of this example are shown in FIGS. 8A to 8B. The same reference characters as used in FIGS. 2A to 2E (Example 1) designate like or corresponding steps and conditions. In this example, the active layer 14 is irradiated with ultraviolet rays from a low-pressure mercury lamp in an atmosphere of dinitrogen oxide so that organic matters present on its surface are removed.

First, a glass substrate 11 is coated with a base silicon oxide film 12, on which is formed a crystalline silicon film 13. (FIG. 8A)

The crystalline silicon film 13 is patterned to be made into the active layer 14 of TFT. The surface of the active layer is irradiated with ultraviolet rays from a low-pressure mercury lamp in an atmosphere of dinitrogen oxide using the apparatus shown in FIG. 1A. The heating temperature is 550° C. (FIG. 8B)

The gate insulating film 15 is formed. Then, the gate electrode 16 is formed and its surrounding area is anodized. The preferred process of forming the gate insulating film consists of forming an oxide film by thermal oxidation at 650° C. or lower (preferably the strain point or lower of the glass substrate) and subsequently forming a silicon oxide film by CVD or sputtering. The subsequent steps are the same as those in Example 1. Thus there is obtained a TFT as shown in FIG. 8E.

EXAMPLE 5

Figure 8C:
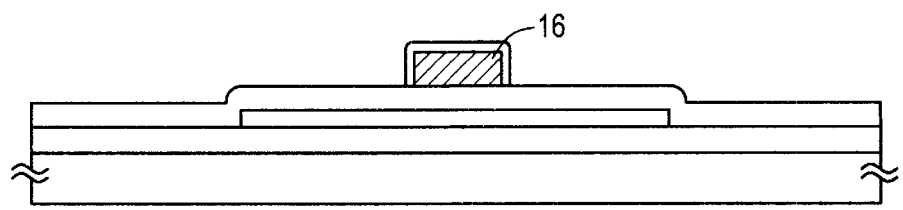
Figure 8D:
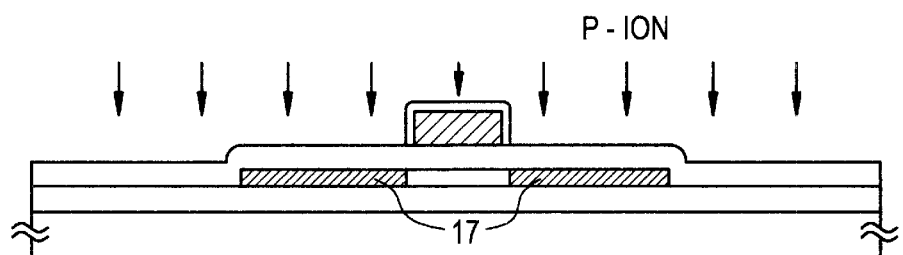
Figure 8E:
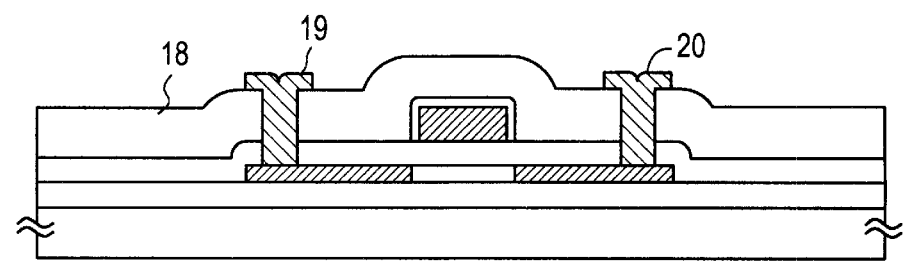
Figure 9:
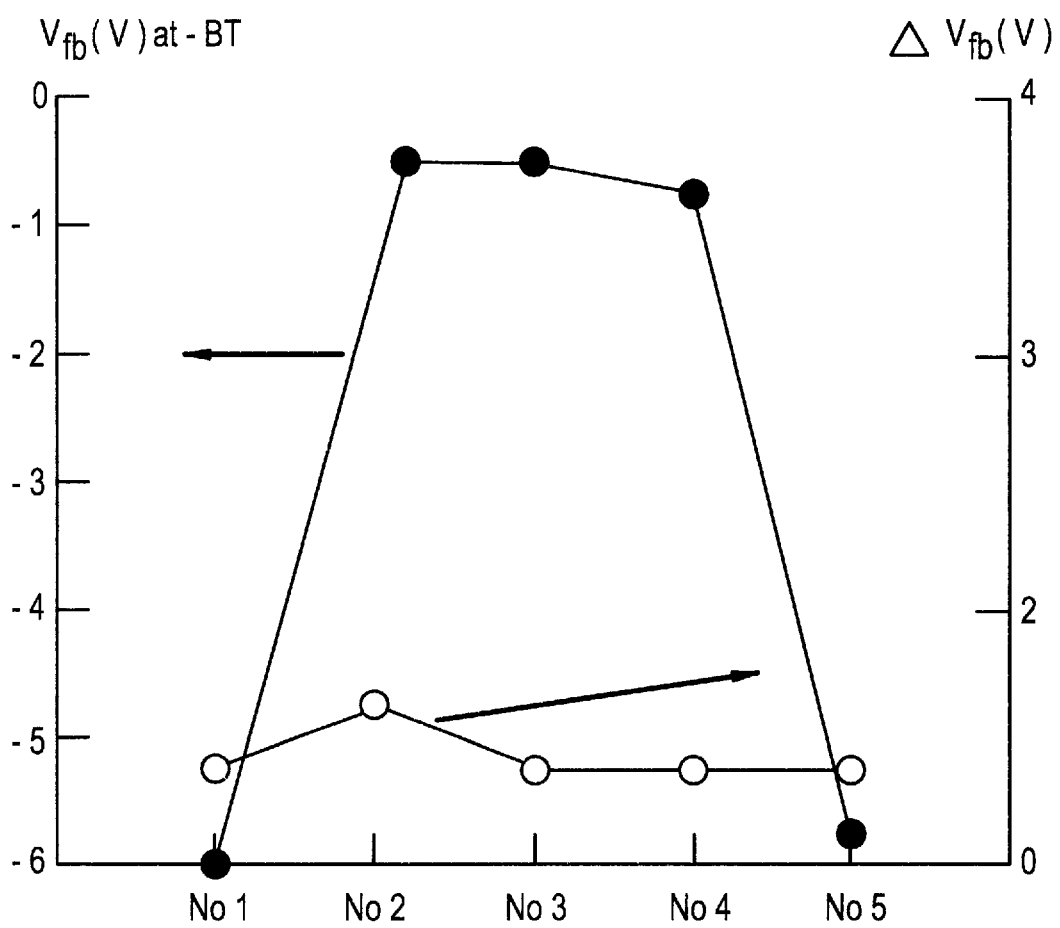
FIGS. 9 and 10 illustrate Example 5.

The MOS of FIG. 8C is tested for characteristic properties. The results are shown in FIG. 9. They permit one to predict the effect of the gate insulating film 15 on the characteristic properties of TFT. No. 1 represents the sample treated at 550° C. in an atmosphere of dinitrogen oxide. No. 2 represents the sample treated at 550° C. in an atmosphere of dinitrogen oxide and then irradiated with ultraviolet rays. No. 3 represents the sample treated at 550° C. in an atmosphere of nitrogen and then irradiated with ultraviolet rays. No. 4 represents the sample treated at 550° C. in an atmosphere of oxygen and then irradiated with ultraviolet rays. No. 5 represents the untreated sample. All the samples were treated for 2 hours. $\Delta V_{fb}$ and BT are defined by $\Delta V_{fb} = +BT - (-BT)$.

Figure 10:
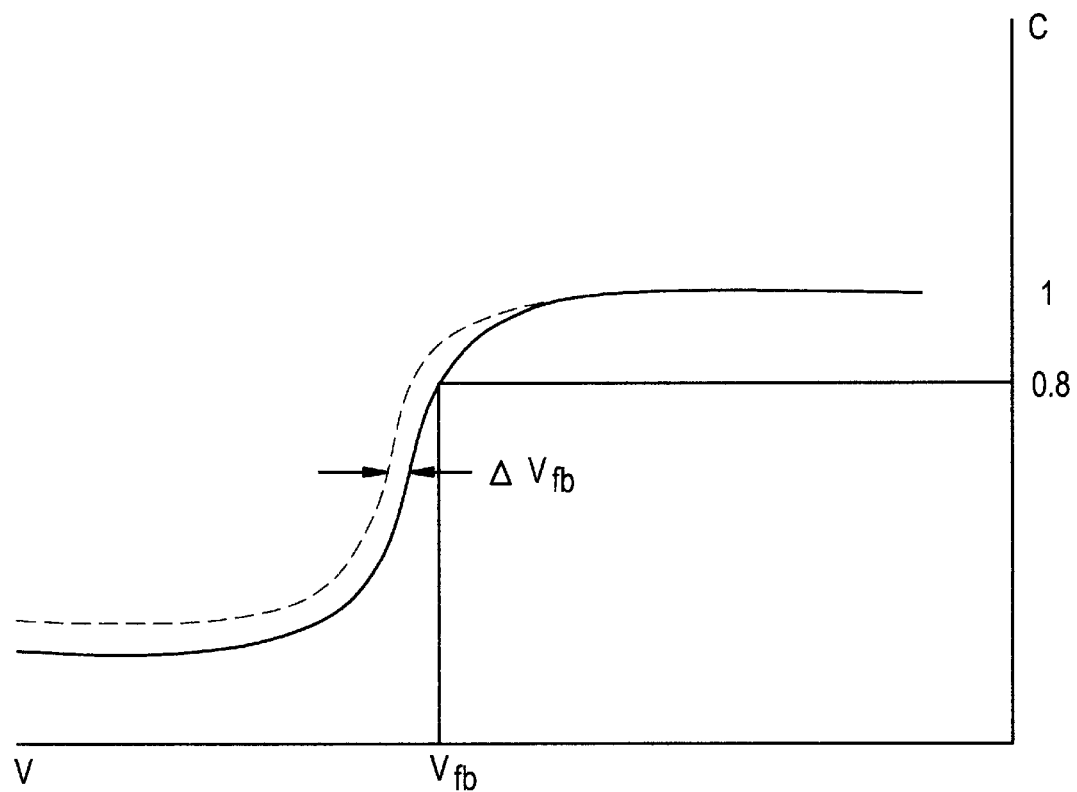

$V_{fb}$ in FIG. 9 is defined as the voltage value at which the value of the normalized C (capacity) is 0.8 in the C-V characteristics shown in FIG. 10. $V_{fb}$ corresponds to the so-called flat band voltage. The flat band voltage is defined as the difference between the work function of the active layer (channel forming region) and the work function of the gate insulating film. It is also defined as the voltage required to eliminate the effect of fixed charges in the active layer (channel forming region) and the gate insulating film.

It can be said that $V_{fb}$ indicates the effect of fixed charges, movable charges, and interface level at the interface between the active layer and the gate insulating film. $V_{fb}$ should preferably be such that no hysteresis occurs when the C-V characteristics are measured. In other words, it is desirable that the value of $\Delta V_{fb}$ is as close to 0 as possible. It is also desirable that the value of $V_{fb}$ be close to 0 V.

As shown by No. 5 in FIG. 9, the untreated sample gives a high value of $V_{fb}$. This suggests poor conditions at the interface between the active layer and the gate insulating film. In other words, this suggests the presence of unnecessary charges or carriers at the interface between the active layer and the gate insulating film.

It is noted from No. 1 that the interface is in poor conditions if the sample is treated simply in a heated atmosphere of dinitrogen oxide. It is noted from No. 2 that the interface is greatly improved if the sample is treated in a heated atmosphere of dinitrogen oxide and is simultaneously irradiated with ultraviolet rays. No. 3 and No. 4 suggest that similar effects are obtained even if dinitrogen oxide is replaced by nitrogen or oxygen.

It is concluded from the foregoing that it is possible to greatly improve the characteristic properties of the interface between the active layer and the gate insulating film if the active layer is treated in a heated atmosphere of any one of dinitrogen oxide, nitrogen, or oxygen, with simultaneous irradiation with ultraviolet rays.

This conclusion may be extended as follows: Treatment in a heated atmosphere of any one of dinitrogen oxide, nitrogen, and oxygen, with simultaneous irradiation with ultraviolet rays, suppresses fixed charges and movable charges that exist or will exist on the surface of the active layer and further prevent the presence of trap level on the surface of the active layer. This effect leads to the improvement of the characteristics of the interface between the active layer and the gate insulating film when the latter is formed on the former.

EXAMPLE 6

FIGS. 11A to 11D show the steps in this example. On a substrate 201 (Corning 7059) is formed by sputtering a silicon oxide film 202 (2000 Å thick) as a base film. Before or after the formation of the underlying film, the substrate is annealed at a temperature higher than its strain point and then cooled slowly below its strain point at a rate of 0.1°–1.0° C./min, so that the shrinkage of the substrate decreases which would take place when the temperature is raised (in the subsequent steps such as thermal oxidation and heat annealing). The decrease in shrinkage makes it easy to align masks. Having a strain point of 593° C., the substrate of Corning 7059 is annealed at 620°–660° C. for 1–4 hours and then cooled slowly to 400°–500° C. at a rate of 0.03°–1.0° C./min, preferably 0.1°–0.3° C./min. The cooled substrate is removed from the chamber.

Figure 11A:
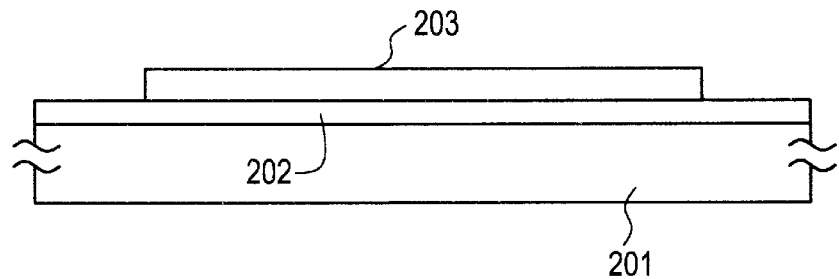
FIGS. 11A to 11D show the steps of producing TFT in Example 6.

An intrinsic (I-type) amorphous silicon film, 500°–1500 Å thick, typically 1000 Å thick, is formed by plasma CVD. For crystallization, it is annealed at 600° C. for 48 hours in an atmosphere of nitrogen (at atmospheric pressure). The silicon film is divided by patterning into small pieces, each measuring 10–1000 μm square. Thus there is formed an island-like silicon film 203 (as the active layer of TFT). (FIG. 11A)

Figure 11B:
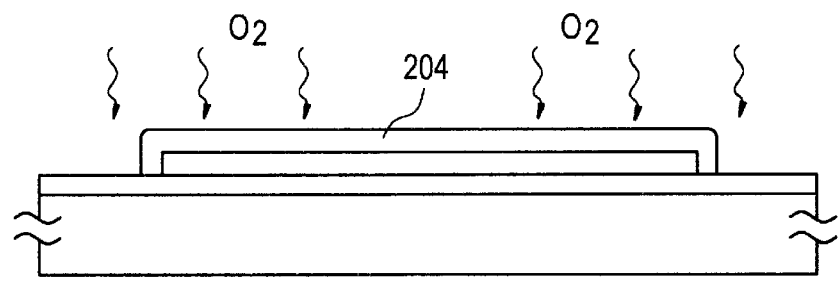

On the active layer 203 is formed a thermal oxidation film 204 by thermal oxidation according to the present invention. The apparatus shown in FIG. 1A is used in this example. Both the first reaction chamber 1 and the second reaction chamber 2 should be at 500°–650° C., preferably 550° C. The pipe connecting them should also be at 550° C. The pressure in each reaction chamber should be at atmospheric pressure. The atmosphere for oxidation is dinitrogen oxide (100%), and the flow rate of oxygen is 5 liter/minute. The thermal oxidation lasts for 0.5–6 hours, typically 2 hours. The reaction chamber 1 is provided with low pressure mercury lamps for ultraviolet rays (with a center wavelength being 246 nm). Thus there is formed a thermal oxidation film 204, approximately 1000 Å thick. (FIG. 11B)

The thermal oxidation removes the surface (more than 50 Å) of the initial silicon film, so that contamination on the top of the silicon film does not reach the silicon—silicon oxide interface. Thus it is possible to obtain a clean silicon— silicon oxide interface. From the fact that the thickness of the silicon oxide film is twice that of the silicon film to be oxidized, it follows that when a 1000 Å thick silicon oxide film is obtained by oxidation of a 1000 Å thick silicon film, the thickness of the remaining silicon film is 500 Å.

After the gate insulating film has been formed by thermal oxidation, a polycrystalline silicon film (containing 0.01–0.2% phosphorus), 3000–8000 Å thick, typically 6000 Å thick, is formed by low pressure CVD. This silicon film is made into the gate electrode 205 by etching. Using this silicon film as a mask for the self-alignment technique, the active layer 203 is implanted with an impurity (phosphorus in this case) to provide the N-type conductivity. The doping gas is phosphine (PH$_3$), the accelerating voltage is 60–90 kV, typically 80 kV, and the dose is 1×10$^{14}$–8×10$^{15}$ atoms/cm$^2$, typically 1×10$^{15}$ atoms/cm$^2$. Thus there are formed N-type impurity regions (source and drain) 206, 207.

Figure 11C:
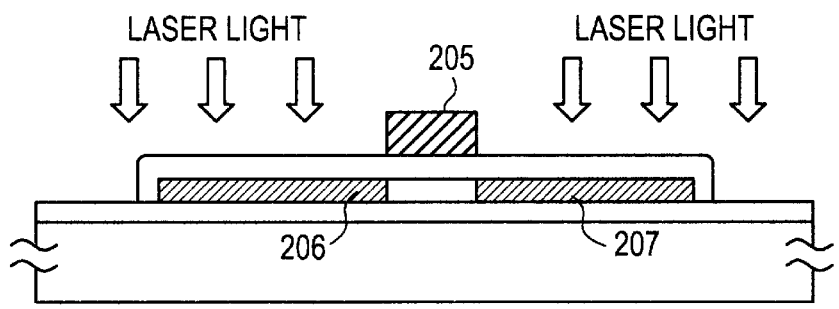

The foregoing step is followed by laser annealing (irradiation with a laser beam). In this example, the laser beam is KrF excimer laser (having a wavelength of 248 nm and a pulse width of 20 ns). It may be replaced by any kind of laser. Irradiation with a laser beam is carried out with an energy density of 200–400 mJ/cm$^2$, typically 250 mJ/cm$^2$. Each place is given 2–10 shots, typically 2 shots. The effect of laser irradiation is enhanced if the substrate is heated to 200°–450° C. (FIG. 11C)

The laser annealing may be replaced by lamp annealing with near infrared rays. Near infrared rays are absorbed by crystallized silicon more easily than amorphous silicon. Therefore, the lamp annealing is comparable to heat annealing at 1000° C. or higher. Near infrared rays are hardly absorbed by the glass substrate (although far infrared rays are absorbed by the glass substrate and visible and near infrared rays of wavelength 0.5–4 μm are hardly absorbed by the glass substrate), and hence the glass substrate does not get hot during annealing and annealing completes within a short time. Therefore, the lamp annealing is suitable in the case where annealing presents a problem with the heat shrinkage of the glass substrate.

Figure 11D:
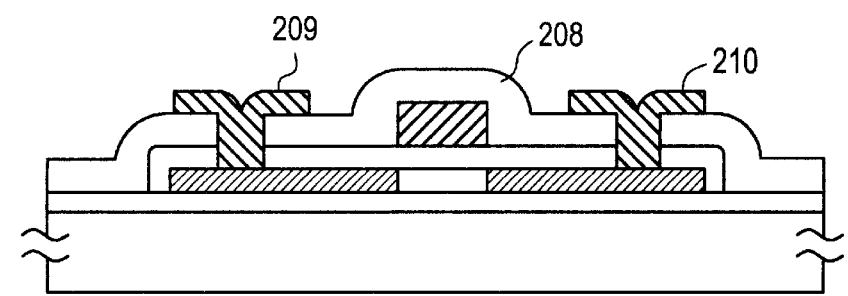

A silicon oxide film 208, 6000 Å thick, as the interlayer insulator, is formed by plasma CVD. Contact holes are formed therein. Electrode/interconnect 209, 210 for TFT is formed from a multilayered film of metals, such as titanium nitride and aluminum. Thus the desired TFT is completed. (FIG. 11D)

The thus obtained TFT has a mobility of 110–150 cm$^2$/Vs, and its S value is of the order of 0.2–0.5 V. A P-channel type TFT produced in the similar way by doping the source/drain with boron gives a mobility of 90–120 cm$^2$/Vs, with the S value being of the order of 0.4–0.6 V. As compared with the TFT in which the gate insulating film is formed by the known PVD or CVD, the TFT in this example gives a mobility which is more than 20% higher and an S value which is more than 20% lower.

In addition, it is found that the TFT in this example is comparable in reliability to the TFT formed by thermal oxidation at a high temperature of 1000° C.

EXAMPLE 7

This example demonstrates the production of TFT used to control the picture elements of active matrix. FIGS. 12A to 12F show the steps in this example. As in Example 6, the glass substrate (Corning 7059) is heated at 630°–660° C., typically 640° C., (which is higher than its strain point of 593° C.) for 1–4 hours, typically 1 hour. Then, it is cooled slowly to 400°–500° C., typically 450° C., at a rate of 0.03°–1° C./min, typically 0.2° C./min. After cooling, the glass substrate is removed from the chamber.

The heat-treated substrate 301 is washed. An underlying film 302 of silicon oxide, 2000 Å thick, is formed by plasma CVD which employs TEOS (tetraethoxysilane) and oxygen as raw materials. An intrinsic (I type) amorphous silicon film 303, 500–1500 Å thick, typically 1000 Å thick, is formed by plasma CVD. A silicon oxide film 305, 500–2000 Å thick, typically 1000 Å thick, is formed by plasma CVD, and subsequently, the silicon oxide film 305 undergoes selective etching to form the region 306 in which amorphous silicon is bared. A nickel film 307, 20–50 Å thick on average, is formed by sputtering on the entire surface. The nickel film may not be continuous. The sputtering may be replaced by spin coating. Incidentally, nickel promotes crystallization of amorphous silicon. Nickel helps reduce the temperature and time required for the growth of the solid phase under normal conditions.

Figure 12A:
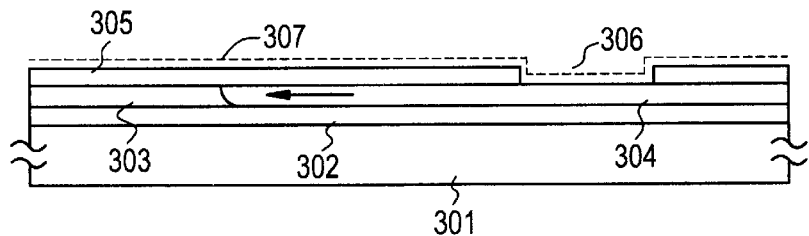
FIGS. 12A to 12F show the steps of producing TFT in Example 7.

The silicon film 303 is crystallized by heat annealing in an atmosphere of nitrogen at 500°–620° C., typically 550° C., for 8 hours. The crystallization starts from the region 306, where nickel comes into contact with the silicon film, and proceeds in the direction parallel to the substrate, as indicated by the arrow. The region 304 is the crystallized portion, and the region 303 is the uncrystallized (amorphous) portion. (FIG. 12A)

The silicon oxide film 305 is removed, and the silicon film 304 undergoes patterning and dry etching so that an island-like active layer region 308 is formed. The region 306 shown in FIG. 12A is that region into which nickel has been directly introduced and hence it contains nickel in high concentration. It has been confirmed that nickel is present in high concentration in the forward end of the crystal growth. It has been found that the concentration of nickel in these regions is one order of magnitude higher than that in the intermediate region. In this example, the active layer 308 is formed such that the region of high nickel concentration is not superposed on the region where the channel is formed. The active layer formed in this example contains nickel in an amount of $1 \times 10^{17}$ to $1 \times 10^{19}$ atoms/cm$^3$, determined by SIMS (secondary ion mass spectrometry).

Figure 12B:
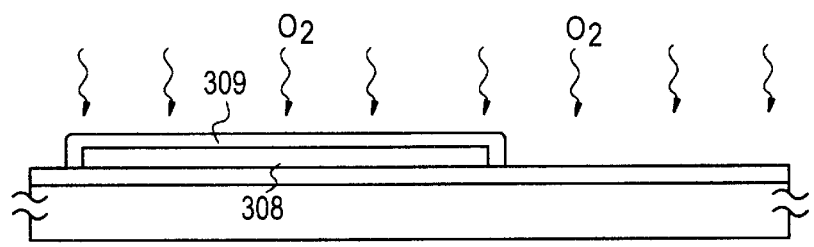

After the formation of the active layer, thermal oxidation is carried out according to the present invention, so that the gate insulating film 309 is formed. In this example, this is accomplished by using the apparatus shown in FIG. 1A. The thermal oxidation employs a 1:1 mixture of dinitrogen oxide and argon, with the second reaction chamber kept at 600° C. The pressure in the reaction chamber is kept at 1 atm, the flow rate of the reaction gas is 8 L/min, and the thermal oxidation lasts for 2 hours. In this way there is obtained a silicon oxide film 304, about 1000 Å thick. (FIG. 12B).

Figure 12C:
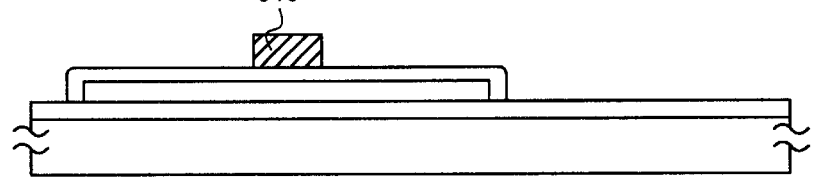

An aluminum film (containing 0.01–0.2% scandium), 3000–8000 Å thick, typically 6000 Å thick, is formed by sputtering. This aluminum film undergoes etching to form the gate insulating film 310. (FIG. 12C)

Figure 12D:
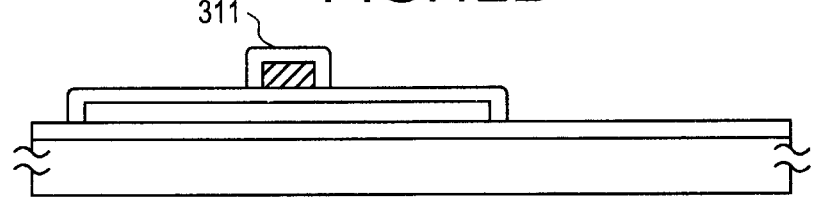

The surface of the aluminum electrode is anodized to form the oxide layer 311 thereon. This anodization is carried out in an ethylene glycol solution containing 1–5% of tartaric acid. The solution is adjusted to pH 6.8–7.2 with ammonia. The resulting oxide film 311 is 2000 Å thick. The oxide film 311 determines the thickness in which the offset gate region is formed by ion doping that follows. Therefore, the step of anodization determines the length of the offset gate region. (FIG. 12D)

The active layer 308 is implanted with an impurity (phosphorus in this example) that imparts the N-type conductivity, by ion doping that uses the gate electrode part (including the gate electrode 310 and its surrounding oxide layer 311) as a mask for the self-alignment technique. The doping gas is phosphine (PH$_3$), the accelerating voltage is 60–90 kV, typically 80 kV, and the dose is $1 \times 10^{14}$–$8 \times 10^{15}$ atoms/cm$^2$, typically $1 \times 10^{15}$ atoms/cm$^2$. Thus there are formed N-type impurity regions 312 and 313. It is apparent from the figure that the impurity region and the gate electrode are offset from each other by a distance x. This offset state is effective in reducing the leak current (or the off current) that appears when a reverse voltage ("minus" in the case of N-channel TFT) is applied to the gate electrode. In the case of TFT to control the picture elements of active matrix, as in this example, a low leak current is desirable for good images because it retains charges accumulated in the electrodes of picture elements. Therefore, the offset effectively meets this requirement.

Figure 12E:
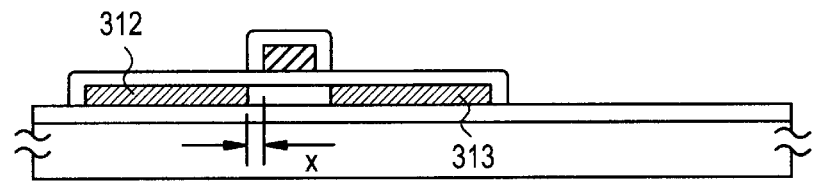

The foregoing step is followed by laser annealing (irradiation with a laser beam). The laser beam is KrF excimer laser (having a wavelength of 248 nm and a pulse width of 20 ns). Irradiation with a laser beam is carried out with an energy density of 200–400 mJ/cm$^2$, typically 250 mJ/cm$^2$. Each place is given 2–10 shots, typically 2 shots. The effect of laser irradiation is enhanced if the substrate is heated to 200°–450° C. (FIG. 12E)

A 6000 Å thick silicon oxide film 314 (as the interlayer insulator) is formed by plasma CVD. On this silicon oxide film 314 is formed an 800 Å thick transparent conductive film (ITO film) by sputtering. A picture element electrode 315 is formed by etching from it.

Figure 12F:
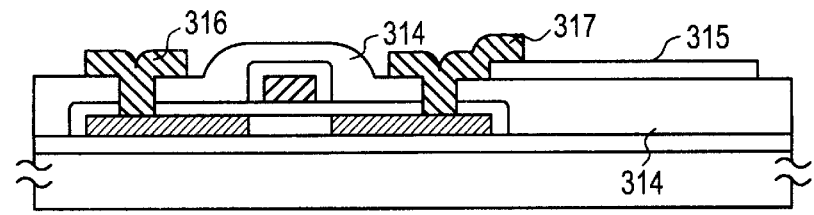

Contact holes are formed in the interlayer insulator 314 and the gate insulating film 309. Electrode/interconnect 316, 317 for TFT is formed from a multilayered film of metals, such as titanium nitride and aluminum. Finally, annealing is carried out at 350° C. for 30 minutes in an atmosphere of hydrogen at 1 atm. Thus the active matrix circuit having TFT is completed. (FIG. 12F)

The thus formed TFT may be covered with a protective film (passivation film) of silicon nitride for circuit protection.

EXAMPLE 8

The steps in this example are shown in section in FIGS. 13A to 13F. A substrate 401 is Corning 7059, the same one as used in Example 6. A 2000 Å thick silicon oxide film as a base film 402 is formed by plasma CVD using TEOS as the raw material. An intrinsic (I type) amorphous silicon film, 100–1000 Å thick, typically 800 Å thick, is formed by plasma CVD.

The amorphous silicon film is incorporated with a trace amount of such elements as nickel, iron, platinum, palladium, and cobalt, which promote its crystallization. Then it undergoes heat annealing to give a crystalline silicon film 13. In this example, this step is accomplished by dropping a solution of nickel acetate on the amorphous silicon film, followed by spin coating which forms an extremely thin film of nickel acetate on the amorphous silicon film. To achieve crystallization, nickel is introduced into the amorphous silicon film by heat annealing at 550° C. for 4 hours in an atmosphere of nitrogen.

To improve crystallinity, the heat annealing is followed by laser annealing with KrF excimer laser (having a wavelength of 248 nm). The energy density of the laser is 250–350 mJ/cm$^2$, typically 300 mJ/cm$^2$. Thus there is obtained a crystalline silicon film. It is composed of comparatively large crystal grains (up to 10 μm square) and has the monodomain structure in which the crystal orientation in the same direction ranges over the distance which is several times to ten-odd times the size of the crystal grain.

Figure 13A:
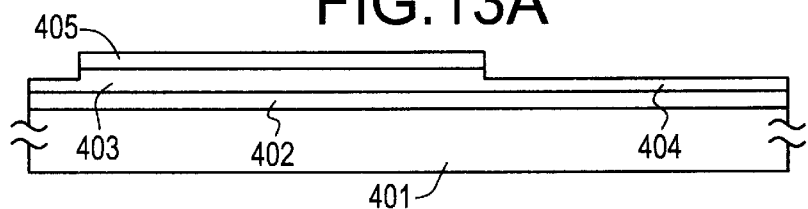
FIGS. 13A to 13F show the steps of producing TFT in Example 8.

A silicon nitrogen film is formed, and it is etched to form a silicon nitride mask 405. This mask 405 is used for dry etching the silicon film (300 Å). Thus there are formed the thick region 403 and thin region 404 of the silicon film. The thick region 405 of the silicon film functions as the active layer of TFT. In this example, active layer like this is formed randomly, but it is observed that many of them are such that the channel-forming region for TFT is of monodomain structure. (FIG. 13A)

With the mask 405 not removed, thermal oxidation is carried out according to the present invention, so that the thin region 404 is oxidized and the silicon oxide film 407 is formed. In this example, the reaction furnace as shown in FIG. 1A is used. The first reaction chamber 1 has the structure as shown in FIG. 6A (sectional view) and FIG. 6B (top view). This structure excludes thin tubes (such as those shown in FIG. 1B) but employs UV sources 9 in the gas reaction chamber 8.

In this example, oxygen (100%) is fed at 1 atm at a flow rate of 5 liter/min. The temperature of the reaction chamber 2 is 500°–650° C., typically 550° C. Thermal oxidation for 4 hours under the above conditions gives rise to the silicon oxide film 407, approximately 1000 Å thick. The thick region of the silicon film 403 is surrounded by the silicon oxide film 407, so that they are isolated from each other.

Figure 13B:
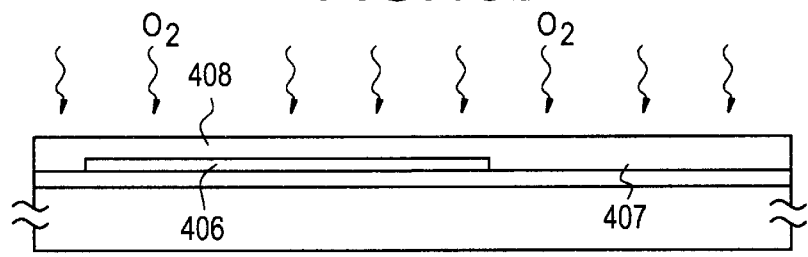

Then, the mask 405 is removed so that the thick region of the silicon film 403 is bared. On the bared surface is formed the silicon oxide film 408 in the same manner as used for thermal oxidation of the silicon oxide film 407. Oxidation takes one hour, so that the silicon oxide film is 500 Å thick. In this way the active layer 406 is formed. (FIG. 13B)

Figure 13C:
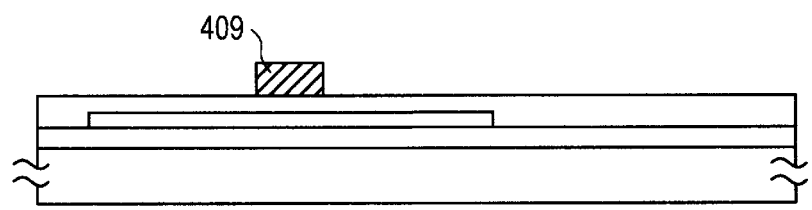

An aluminum film (containing 0.01–0.2% scandium), 3000–8000 Å thick, typically 6000 Å thick, is formed by sputtering. This aluminum film undergoes etching to form the gate electrode 409. (FIG. 13C)

Figure 13D:
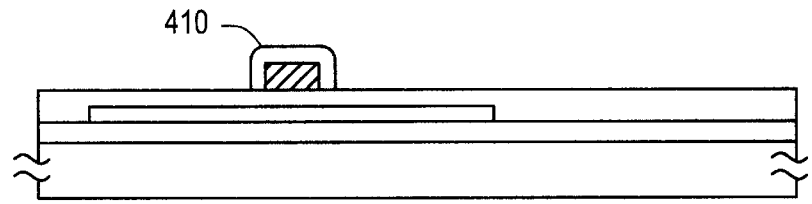

The surface of the aluminum electrode is anodized to form the oxide layer 410 thereon. This anodization is carried out in the same manner as in Example 7. The resulting oxide film 410 is 2000 Å thick. (FIG. 13D)

The active layer 406 is implanted with an impurity (phosphorus in this example) that imparts the N-type conductivity, by ion doping that uses the gate electrode part (including the gate electrode 409 and its surrounding oxide layer 410) as a mask for the self-alignment technique. The doping gas is phosphine (PH$_3$), the accelerating voltage is 60–90 kV, typically 80 kV, and the dose is $1\times10^{14}$–$8\times10^{15}$ atoms/cm$^2$, typically $4\times10^{14}$ atoms/cm$^2$. Thus there are formed N-type impurity regions 411 and 412.

Figure 13E:
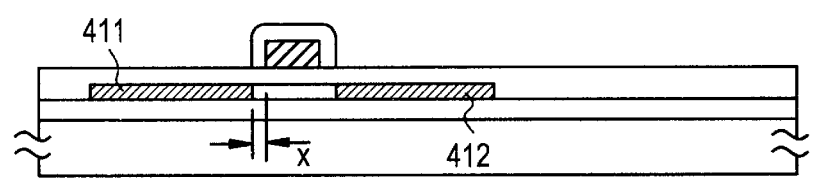

The foregoing step is followed by laser annealing (irradiation with a laser beam). The laser beam is KrF excimer laser (having a wavelength of 248 nm and a pulse width of 20 ns). Irradiation with a laser beam is carried out with an energy density of 200–400 mJ/cm$^2$, typically 250 mJ/cm$^2$. Each place is given 2–10 shots, typically 2 shots. (FIG. 13E)

A silicon nitride film 413 (as the interlayer insulator) is formed by plasma CVD. The silicon nitride film 413 and the silicon oxide film 408 undergo etching to form the contact hole 414. This etching employs buffered hydrofluoric acid (a mixture of hydrofluoric acid and ammonium fluoride). In general, the silicon nitride film formed by plasma CVD is slower in etching as compared with the silicon oxide film formed by PVD or CVD. This is not true in this example, because the silicon oxide film 408 is formed by thermal oxidation and hence it can be etched at the same rate as the silicon nitride film 413 (as the interlayer insulator).

For this reason, the resulting contact hole has approximately the same diameter over its entire length. This structure is effective in preventing interconnects from breaking at contact holes. If the contact hole has a larger diameter at its top than at its bottom, interconnects are liable to break. In this example, the silicon nitride film 413 (as the interlayer insulator) functions also as a film which prevents the entrance of water and movable ions into TFT from outside.

Figure 13F:
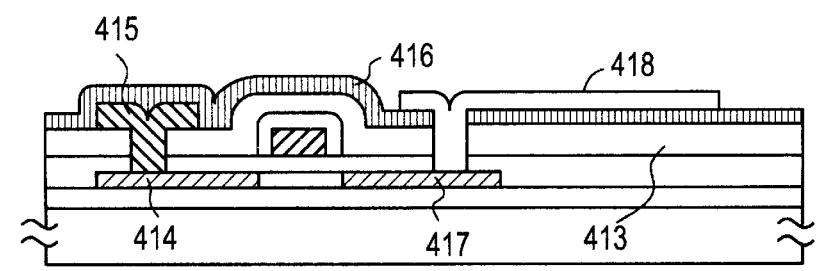
Figure 14:
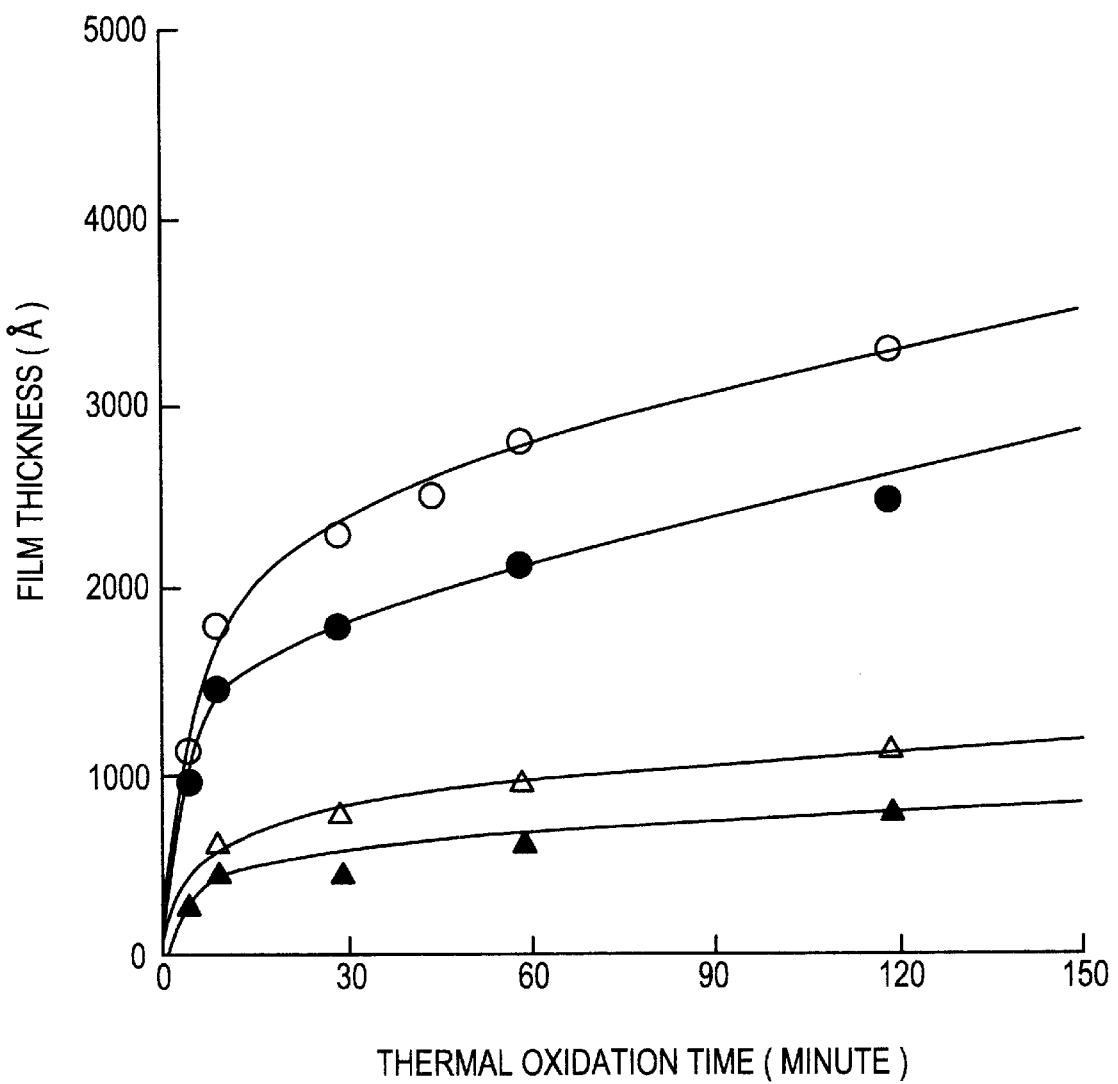
FIG. 14 shows thermal oxidation at low temperatures (600° C. or lower).

After the contact hole has been formed, an aluminum film is formed by sputtering. This aluminum film is etched to form the source electrode/interconnect 415. A polyimide film, 2000 Å thick, is formed by spin coating. The polyimide film 416, the interlayer insulator (of silicon nitride) 413, and the gate insulating film 408 are etched to form the contact hole 417. A transparent conductive film (ITO film) is formed, and this film is etched to form the picture element electrode 418. In this way the active matrix circuit is formed. (FIG. 13F)

The gate insulating film (500 Å thick) in this example is thinner than that in other examples. However, it is completely free of pin holes unlike the one formed by the conventional PVD or CVD. In addition, it has a practically high voltage resistance. TFT of monodomain structure, like the one in this example, is poor in characteristic properties, if the gate insulating film is thicker than necessary. The sample of TFT in this example, in which the gate insulating film is about 500 Å thick, fully exhibits characteristic properties due to monodomain structure.

This example has an advantage over Examples 6 and 7 in the covering of stepped layers. In Examples 6 and 7, the active layer (including the gate insulating film) has a difference in level which is as great as 1500 Å. With the gate electrode covered incompletely, breakage of the gate electrode/interconnect is likely to occur.

EXAMPLE 9

The steps in this example are shown in section in FIGS. 15A to 15D. On a glass substrate 701 are formed a base silicon oxide film 702 (2000 Å thick) and an island-like crystalline silicon film 703 (750 Å thick), The silicon film 703 is oxidized by thermal oxidation according to the present invention, so as to form the silicon oxide film 704. As in Example 8, this step is carried out using the reaction furnace of the structure shown in FIG. 1A. The first reaction chamber 1 is constructed as shown in FIG. 6A (sectional view) and FIG. 6B (top view).

Figure 15A:
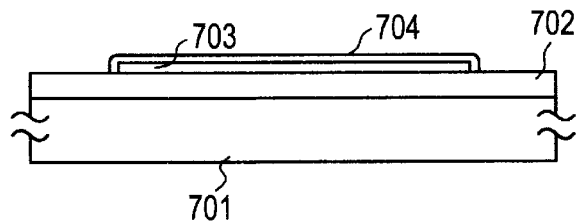
FIGS. 15A to 15D show the steps of producing TFT in Example 9.

In this example, dinitrogen oxide (100%) at 1 atm is fed at a flow rate of 5 liter/minute. The temperature in the second reaction chamber is 500°–650° C., typically 550° C. Thermal oxidation is carried out for 1 hour under the above conditions. As the result, the silicon oxide film 704, approximately 500 Å thick, is formed. (FIG. 15A)

Figure 15B:
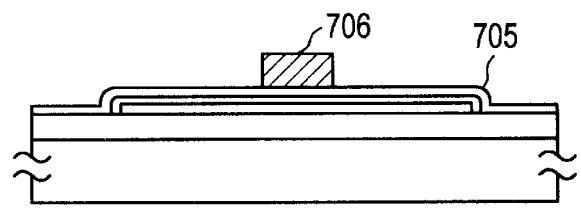

Then, a 5000 Å thick silicon oxide film 705 is formed by plasma CVD using monosilane and dinitrogen oxide as raw materials. The substrate temperature is 400°–500° C., typically 430° C. Then, an aluminum film (containing 0.01–0.2% scandium), 3000–8000 Å thick, typically 6000 Å thick, is formed by sputtering. This aluminum film undergoes etching to form the gate electrode 706. (FIG. 15B)

The surface of the aluminum electrode is anodized to form the oxide layer 407 thereon. This anodization is carried out in the same manner as in Example 2. The resulting oxide film 707 is 2000 Å thick.

Figure 15C:
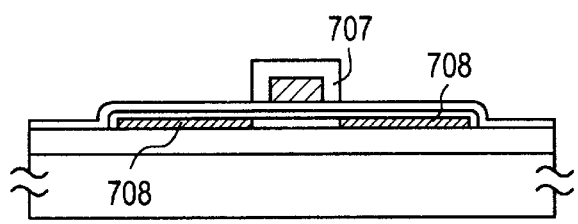

The active layer 704 is implanted with an impurity (phosphorus in this example) that imparts the N-type conductivity, by ion doping that uses the gate electrode part (including the gate electrode 706 and its surrounding oxide layer 707) as a mask for the self-alignment technique. The doping gas is phosphine (PH$_3$), the accelerating voltage is 80 kV, and the dose is typically $4\times10^{14}$ atoms/cm$^2$. Thus there is formed N-type impurity regions 708. (FIG. 15C)

The foregoing step is followed by laser annealing (irradiation with a laser beam). The laser beam is KrF excimer laser (having a wavelength of 248 nm and a pulse width of 20 ns).

Further, a silicon nitride film 709 (as the interlayer insulator) is formed by plasma CVD. The silicon nitride film 709 is etched to form the contact hole 710.

Figure 15D:
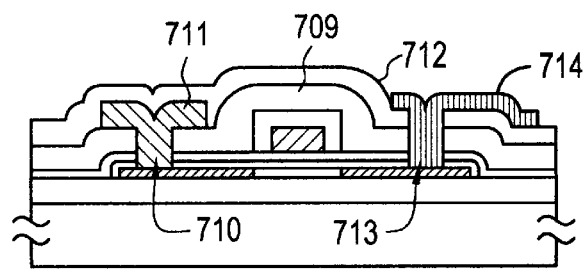

After the contact hole has been formed, an aluminum film is formed by sputtering. This aluminum film is etched to form the source electrode/interconnect 711. A 2000 Å thick silicon oxide film 712 is formed by plasma CVD. The silicon oxide film 712 and the interlayer insulator of silicon nitride 709 are etched to form the contact holed 713. Then, a transparent conductive film (ITO film) is formed, and this film is etched to form the picture element electrode 714. In this way the active matrix circuit is formed. (FIG. 15D)

In this example, the gate insulating film can be made sufficiently thick in a short time because it is formed in double from the thermal oxidation film and the silicon oxide film formed by plasma CVD.

EXAMPLE 10

This example is shown in FIGS. 17A to 17E. In this example, a silicon oxide film formed by sputtering is used as the gate insulating film and an N-channel TFT is formed by heat annealing conforming to the present invention.

On a substrate 61 (Corning 7059, 100×100 mm) is formed by sputtering a silicon oxide film (1000–3000 Å thick, typically 2000 Å thick) which functions as a base oxide film 62, which excludes contamination from the substrate. The silicon oxide film undergoes heat annealing at 640° C. for 4 hours in an atmosphere of oxygen or dinitrogen oxide. This heat annealing is intended to stabilize the surface state.

Figure 17A:
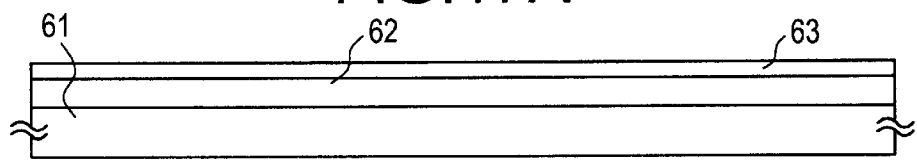
FIGS. 17 to 17E show the steps in Example 10.

An amorphous silicon film (100–1500 Å thick, typically 500 Å thick) is formed by plasma CVD. It is subsequently annealed to be made into a crystalline silicon film 63. To promote crystallization, the amorphous silicon film is incorporated with a slight amount of elements (such as nickel, iron, platinum, palladium, and cobalt). In this example, a solution of nickel acetate is dropped on the amorphous silicon film, followed by spin coating to make an extremely thin film. For crystallization, nickel is introduced into the amorphous silicon film by heat annealing at 550° C. for 4 hours in an atmosphere of nitrogen. To improve the crystallinity of the resulting crystalline silicon film, the foregoing step may be followed by laser annealing. (FIG. 17A)

The crystalline silicon film 63 undergoes etching to form an island-like silicon film 64 which is the active layer of TFT. The island-like film 64 and its surrounding area are covered with a silicon oxide film (200–1500 Å thick, typically 1000 Å thick) which is formed by sputtering in an atmosphere of oxygen. This silicon oxide film functions as the gate insulating film 65. In this example, the sputtering employs a target of synthetic quartz. The sputter gas may be argon. The pressure of the sputter gas is 1 Pa, the electric power applied is 350 W, and the temperature of the substrate is 200° C.

Figure 16A:
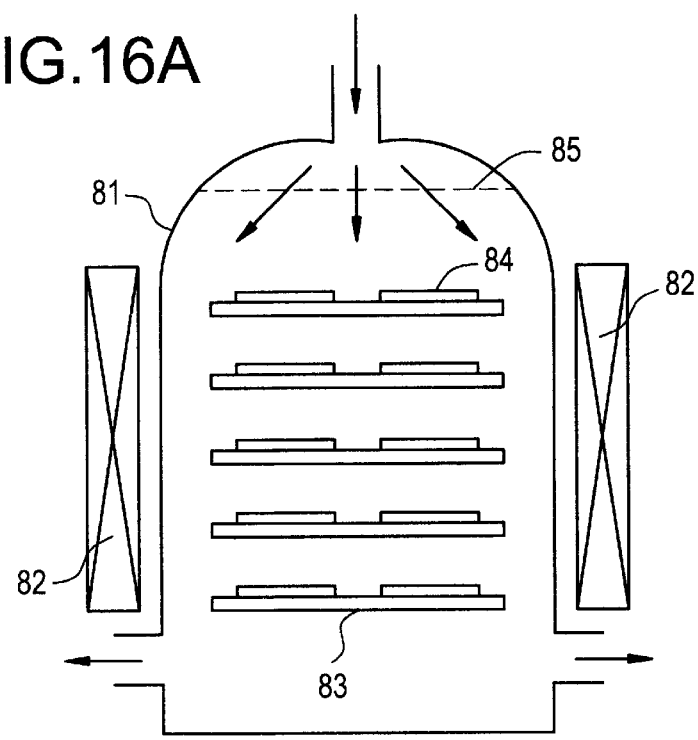
FIGS. 16A and 16B are schematic representations of an apparatus used to practice the present invention.
Figure 17B:
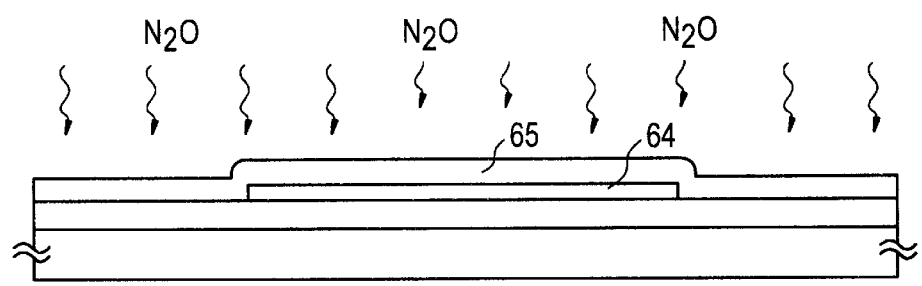

The gate insulating film 65 undergoes annealing as specified in the present invention. This annealing is intended to improve the characteristics of the interface between the gate insulating film and the active layer. In this example, the apparatus shown in FIG. 16A is used. The reticulate catalyst 85 is an 80–250 mesh platinum net. The distance between the catalyst 85 and the substrate 84 is 20–80 cm. The gas used for annealing is dinitrogen oxide (100%). The temperature of the heat-annealing furnace 81 is 500°–650° C., typically 550° C. The pressure of the heat-annealing furnace is 0.5–1.1 atm, typically 1 atm. A lower pressure than this is acceptable. The chamber is supplied with dinitrogen oxide at a flow rate of 5 liter/minute. The heat annealing lasts for 0.5–6 hours, typically 1 hour. As the result of this treatment, the amount of hydrogen at the interface between the silicon oxide film and the silicon film is reduced by nitriding or oxidation and conversely the amount of nitrogen at the interface is increased. (FIG. 17B)

Figure 17C:
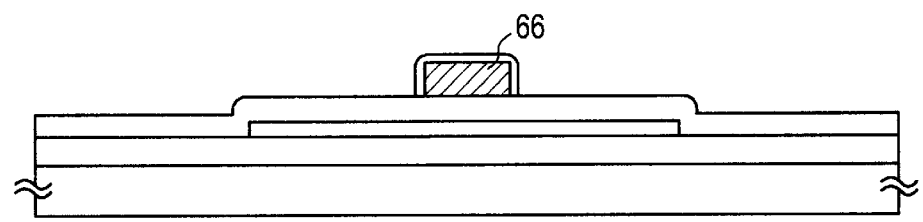

An aluminum film (containing 1 wt % of Si or 0.1–0.3 wt % of Sc), 3000 Å-2 μm thick, typically 5000 Å thick, is formed by sputtering. A gate electrode 66 is formed from this aluminum film by patterning. The substrate is dipped in a solution of ethylene glycol containing 1–3% tartaric acid (adjusted to approximately pH 7 with ammonia) and anodized, with the aluminum gate electrode 66 being an anode and platinum being a cathode. The anodization is performed such that the voltage is increased to 140 V at a constant current and this state is maintained for 1 hour. In this way an anodized film (about 2000 Å thick) is formed. (FIG. 17C).

Figure 17D:
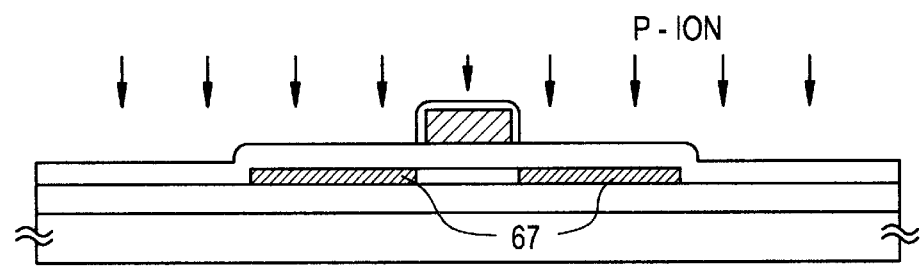

The island-like silicon film 64 is implanted with phosphorus (as an impurity) by ion doping using the self-alignment technique which employs the gate electrode 66 as a mask. The dose is $1\times10^{14}$–$8\times10^{15}$ atoms/cm$^2$, and the accelerating voltage is 50–90 kV. In this example, the dose is $1\times10^{15}$ atoms/cm$^2$ and the accelerating voltage is 80 kV. In this way there is formed the N-type impurity region (source/drain region) 67. (FIG. 17D)

The doped impurity region is activated by irradiation with a laser beam (KrF excimer laser, having a wavelength of 248 nm, a pulse width of 20 ns, and an energy density of 200–400 mJ/cm$^2$, typically 250 mJ/cm$^2$).

Figure 17E:
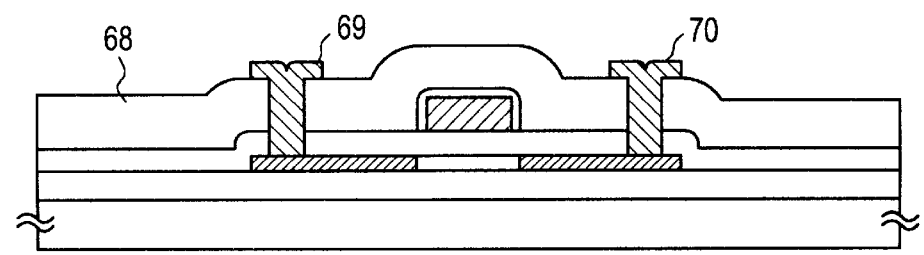

The entire surface is covered with a silicon oxide film, 3000 Å thick, as the interlayer insulating film 68, which is formed by plasma CVD. The interlayer insulating film 68 and the gate insulating film 65 undergo etching so that contact holes are formed in the source/drain region 67. An aluminum film, 5000 Å thick, is formed by sputtering, and it is etched to form the source/drain electrodes 69, 70. In this way there is obtained an N-channel type TFT. (FIG. 17E)

The thus obtained TFT exhibits good characteristic properties with a minimum of degradation, because its gate insulating film has a good voltage resistance. TFT is tested for the degradation of its characteristic properties by varying the gate voltage in −17 V to +17 V, with the drain voltage fixed at +14 V. The ratio of degradation is defined by $1-(\mu_{10}/\mu_0)$, where $\mu_0$ is the field effect mobility measured initially and $\mu_{10}$ is the field effect mobility measured after voltage application. In the case of TFT obtained in this example, the ratio of degradation defined as above is 1.3%.

For the purpose of comparison, the same procedure as above was repeated except that the gate insulating film is annealed at 550° C. for 3 hours in an atmosphere of nitrogen (in place of dinitrogen oxide). In this case the ratio of degradation is 52.3%. Presumably, this is because nitrogen is not made reactive by the catalyst.

EXAMPLE 11

This example is shown in FIGS. 18A to 18F. In this example, a silicon oxide film deposited by plasma CVD (which employs TEOS and oxygen as the raw material gases) is used as the gate insulating film and a CMOS type TFT is formed by heat annealing conforming to the present invention.

Figure 18A:
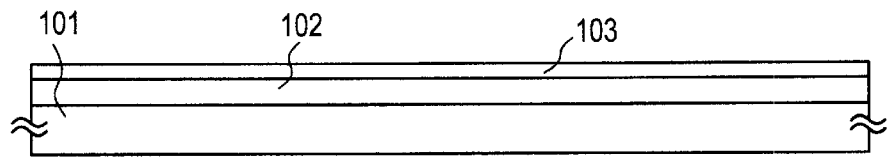
FIGS. 18A to 18F show the steps in Example 11.

On a substrate 101 (NA35 made by NH Technoglass, 100×100 mm) is formed by sputtering a silicon oxide film 102 (2000 Å thick) which functions as an underlying oxide film. An amorphous silicon film (500 Å thick) is formed by plasma CVD. A solution of nickel acetate is applied by spin coating in the same manner as in Example 10 so that a film of nickel acetate is formed on the amorphous silicon film. The amorphous silicon film undergoes heat annealing at 550° C. for 4 hours in an atmosphere of nitrogen, so that nickel is introduced into it for crystallization. For the improvement of crystallinity, the crystalline silicon film undergoes laser annealing by KrF excimer laser (having a wavelength of 248 nm). The energy density of the laser is 250–350 mJ/cm$^2$, typically 300 mJ/cm$^2$). In this way there is obtained the crystalline silicon film 103. It is composed of comparatively large crystal grains (up to 10 μm square) and has the monodomain structure in which the crystal orientation in the same direction ranges over the distance which is several times to ten-odd times the size of the crystal grain. (FIG. 18A)

The crystalline silicon film 103 undergoes etching to form an island-like silicon film 104, 105 which is the active layer of TFT. In this example, the active layers are formed randomly, but many of them are found to be such that the region in which the channel of TFT is formed is of monodomain structure.

The island-like silicon film 104, 105 is covered with a silicon oxide film (200–1500 Å thick, typically 1000 Å thick) which is formed by plasma CVD that employs TEOS and oxygen as raw material gases. The plasma CVD is performed under the condition that the gas pressure is 4 Pa, the electric power is 150 W, and the substrate temperature is 350° C. This silicon oxide film functions as the gate insulating film 106.

Figure 16B:
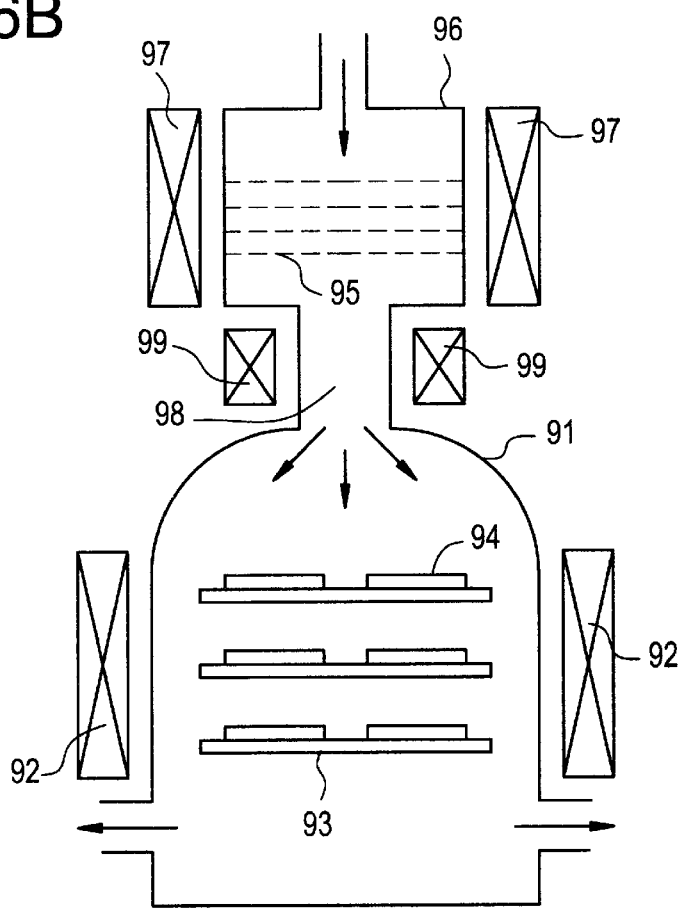

The gate insulating film undergoes annealing as specified in the present invention. This annealing is intended to improve the characteristics of the gate insulating film, especially the interface between the gate insulating film and the active layer. In this example, the heat annealing is carried out such that the substrate is placed in the heat annealing apparatus as shown in FIG. 16B and is heated at 350° C. for 2 hours under a stream of hydrogen in the heat annealing chamber 91. This heat annealing introduces hydrogen into dangling bonds present in the silicon oxide film.

Then, a 1:1 mixture of dinitrogen oxide and argon is fed. The temperature of the catalyst reaction chamber is 200°–600° C., the temperature of the pipe 98 is 200°–600° C., and the temperature of the heat annealing furnace 91 is 400°–700° C. In this example, they are 400° C., 400° C., and 600° C., respectively. The pressure in the reaction chamber is 1 atm, the flow rate of the reaction gas is 3 L/min, and the length of time for the heat annealing is 1 hour. Incidentally, the catalyst reaction chamber 96 is provided with a catalyst 95, which is reduced nickel in the form of net. In this example it is possible to keep the catalyst temperature lower than that in Example 10. The low temperature permits the catalyst to decompose dinitrogen oxide for a long period of time without the catalyst degrading.

Figure 18B:
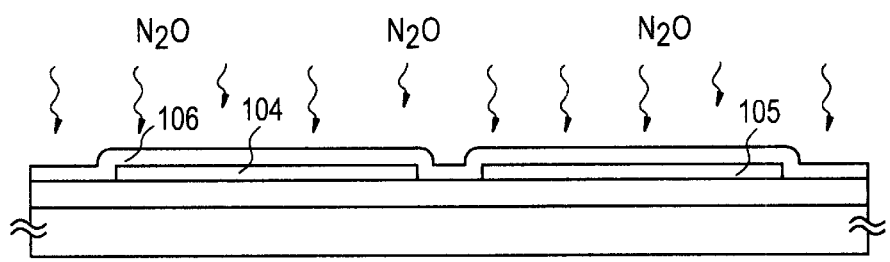

The heat annealing reduces, by nitriding or oxidation, the amount of hydrogen in the silicon oxide film and in the interface of it and the silicon film. The heat annealing also reduces, by oxidation, the amount of carbon contained in the silicon oxide film formed from TEOS. Carbon is oxidized into carbon oxide which releases itself. In this way there is obtained the silicon oxide film suitable for the gate insulating film. (FIG. 18B)

Figure 18C:
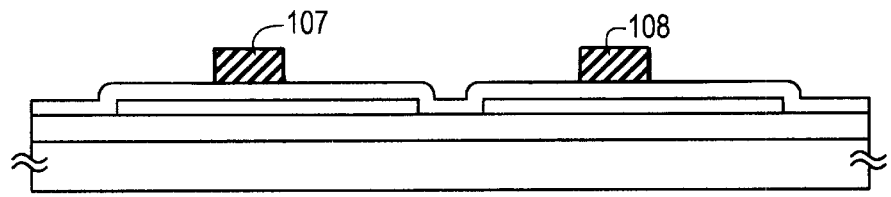

A polycrystalline silicon film (6000 Å thick) is formed by low pressure CVD. It is made into the gate electrodes 107, 108 by patterning. The polycrystalline film is incorporated with a trace amount of phosphorus to improve its conductivity. (FIG. 18C)

Figure 18D:
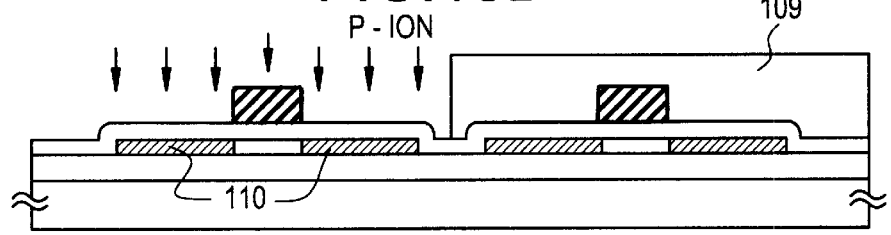

Then, the island-like silicon film 104, 105 is implanted with impurities by ion doping using the self-alignment technique which employs the gate electrode 107, 108 as a mask. First, phosphorus is implanted such that the region in which the P-channel type TFT is formed is covered by the photoresist mask 109. In this way the N-type impurity region 110 (source/drain region) is formed. The dose is $1 \times 10^{14} - 8 \cdot 10^{15}$ atoms/cm$^2$, and the accelerating voltage is 50–90 kV. In this example, the dose is $5 \times 10^{14}$ atoms/cm$^2$ and the accelerating voltage is 80 kV. (FIG. 18D)

Figure 18E:
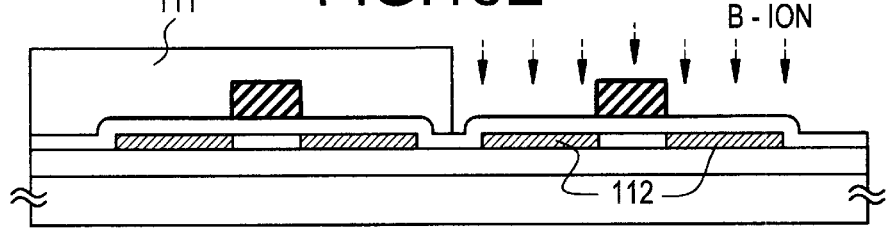

Boron is implanted such that the region in which the N-channel type TFT is formed is covered by the photoresist mask 111. In this way the P-type impurity region 112 (source/drain region) is formed. The preferred dose is $1 \times 10^{14} - 8 \times 10^{15}$ atoms/cm$^2$, and the preferred accelerating voltage is 40–80 kV. In this example, the dose is $1 \times 10^{15}$ atoms/cm$^2$ and the accelerating voltage is 65 kV. (FIG. 18E)

The doped impurity regions 111 and 112 are activated by irradiation with a laser beam (KrF excimer laser, having a wavelength of 248 nm, a pulse width of 20 ns, and an energy density of 200–400 mJ/cm$^2$, typically 250 mJ/cm$^2$).

Figure 18F:
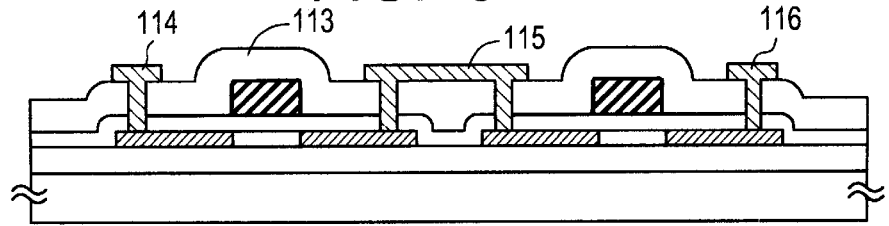

The entire surface is covered with a silicon oxide film, 5000 Å thick, as the interlayer insulating film 113, which is formed by plasma CVD. The interlayer insulating film 113 and the gate insulating film 106 undergo etching so that contact holes are formed in the source/drain region 110, 112. An aluminum film, 5000 Å thick, is formed by sputtering, and it is etched to form the source/drain electrodes 114, 115, 116. In this way there is obtained a CMOS-type TFT. (FIG. 18F)

EXAMPLE 12

This example is shown in FIGS. 19A to 19F. In this example, a silicon oxide film formed by ECR-CVD is heat-annealed to form P-channel type TFT as the switching transistor (picture element TFT) for the active matrix circuit.

On a substrate 51 (100×100 mm) is formed by low pressure CVD a silicon oxide film (3000 Å thick) which functions as an underlying oxide film 52. An amorphous silicon film (500 Å thick) is formed by plasma CVD. A solution of nickel acetate is applied by spin coating in the same manner as in Example 10, so that a film of nickel acetate is formed on the amorphous silicon film. For crystallization, the amorphous silicon film undergoes heat annealing at 500° C. for 4 hours in an atmosphere of nitrogen. Thus there is obtained the crystalline silicon film 53. To improve the crystallinity, the crystalline silicon film may undergo laser annealing.

The crystalline silicon film 53 undergoes patterning to form an island-like silicon film 54 which is the active layer of TFT. The island-like silicon film is covered with a silicon oxide film 55 (1200 Å thick) as the gate insulating film, which is formed by ECR-CVD that employs monosilane (SiH$_4$) as the raw material gas and dinitrogen oxide as the oxidizing agent. The latter may be replaced by oxygen (O$_2$), nitrogen monoxide (NO), or nitrogen dioxide (NO$_2$). This step is carried out by using microwave (2.45 MHz, 400 W), with the substrate being not heated.

Incidentally, it is possible to form a silicon oxide film having the comparable characteristic properties by low pressure CVD (at 0.1–10 torr and 300°–500° C.) which employs the same raw material gas and oxidizing agent as mentioned above.

Figure 22A:
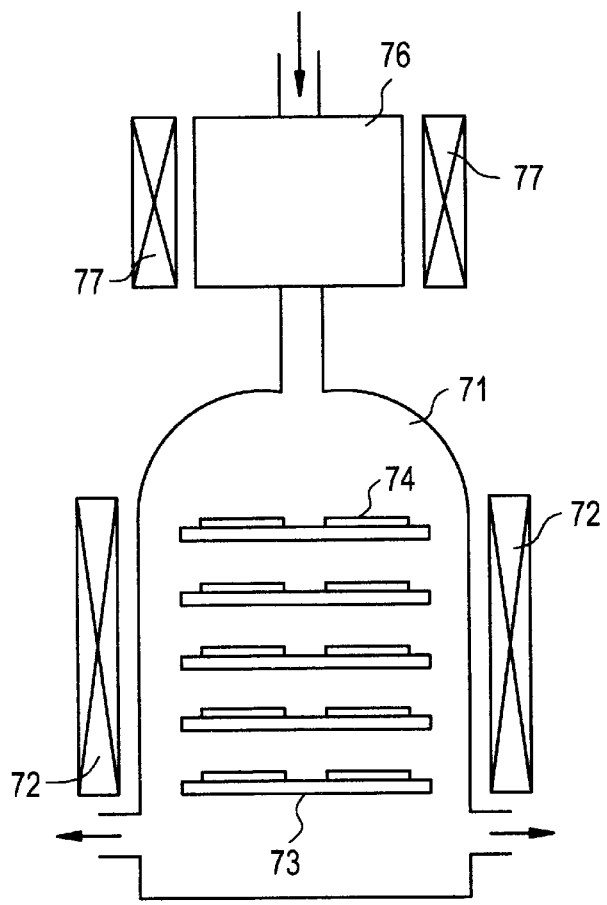
FIGS. 22A and 22B are schematic representations of another apparatus used to practice the present invention.
Figure 22B:
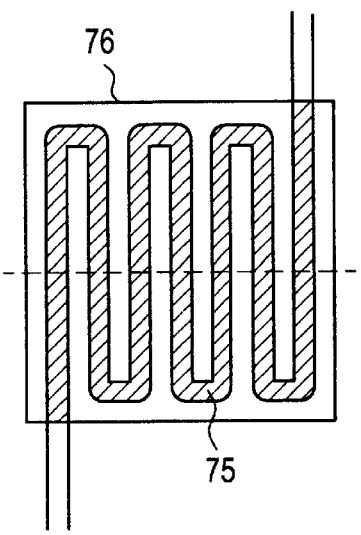

After the gate insulating film has been formed, annealing is carried out according to the present invention so as to improve the characteristic properties of the gate insulating film. This example employs the apparatus shown in FIG. 22A. The catalyst reaction chamber 76 is provided with a winding pipe which is filled with titanium-adsorbed granular or powdery silica gel 75 (shown in FIG. 22B). The catalyst reaction chamber 76 is heated to 200°–400° C., typically 300° C., by the heaters 77.

Figure 19A:
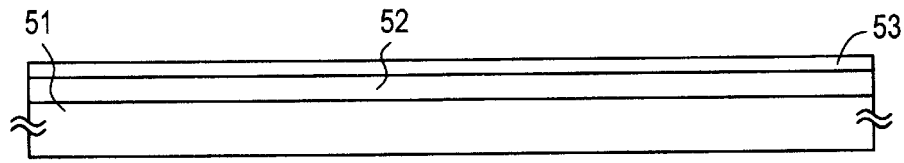
FIGS. 19A to 19F show the steps in Example 12.
Figure 19B:
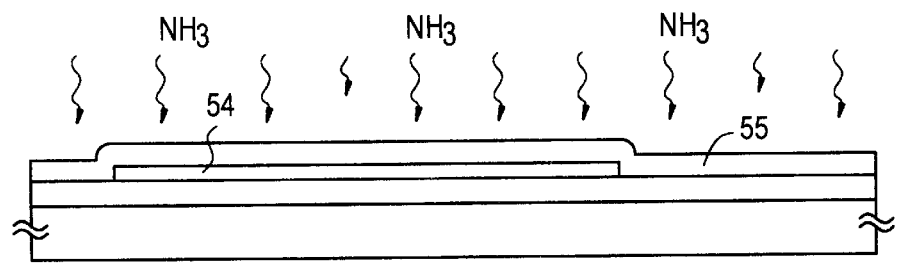

The heat-annealing furnace 71 is provided with a plurality of susceptors 73 to hold the substrates 7. The reaction chamber 71 is kept at a constant temperature by the heaters 72. In this example, the heat-annealing furnace is kept at 550° C. The atmosphere for heat annealing is ammonia diluted to 1–5% with argon. The heat-annealing furnace 71 is fed with the diluted ammonia at a flow rate of 5 L/min. Heat annealing for 1 hour under this condition nitrides the silicon oxide film. Then, heat annealing may be continued, with the reaction gas switched to dinitrogen oxide, under the same condition as in Examples 10 and 11. (FIG. 19B)

Figure 19C:
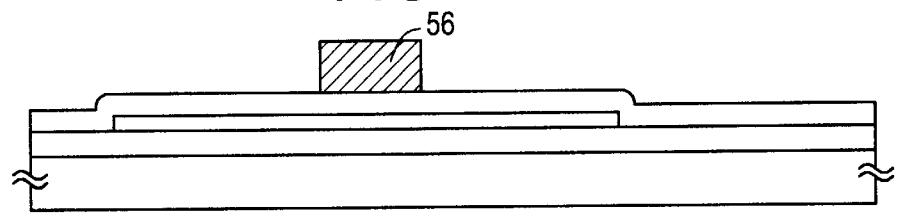

An aluminum film (6000 Å thick) is formed by sputtering. It is formed into the gate electrode 56 by patterning. It is incorporated with a trace amount (0.1–0.5 wt %) of scandium to prevent the growth of hillocks. (FIG. 19C)

Figure 19D:
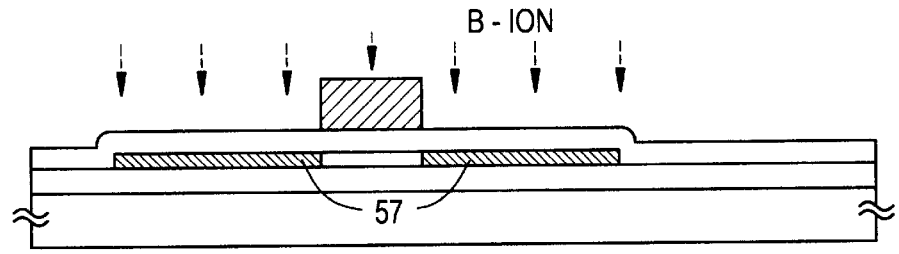
Figure 19E:
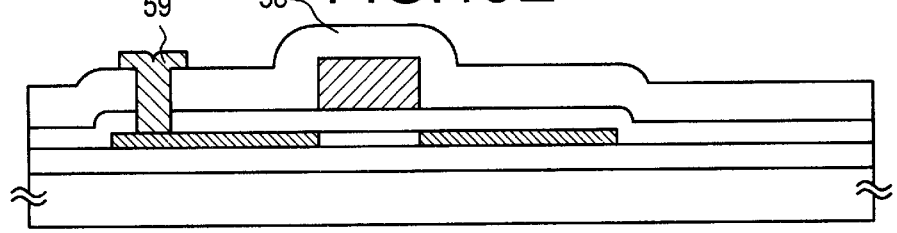

Then, the island-like silicon film 54 is implanted with boron as an impurity by ion doping using the self-alignment technique which employs the gate electrode 56 as a mask. The dose is $1\times10^{14}$–$8\times10^{15}$ atoms/cm$^2$ (typically $1\times10^{15}$ atoms/cm$^2$), and the accelerating voltage is 40–80 kV (typically 65 kV). In this way the P-type impurity region 57 (source/drain region) is formed. (FIG. 19D)

The doped impurity region 57 is activated by irradiation with a laser beam (KrF excimer laser, having a wavelength of 248 nm, a pulse width of 20 ns, and an energy density of 200–400 mJ/cm$^2$, typically 250 mJ/cm$^2$).

The entire surface is covered with a silicon oxide film, 3000 Å thick, as the interlayer insulating film 58, which is formed by plasma CVD. The interlayer insulating film 58 and the gate insulating film 55 undergo etching so that contact holes are formed in the source region. An aluminum film, 5000 Å thick, is formed by sputtering, and it is etched to form the source electrode 59. (FIG. 15E)

Figure 19F:
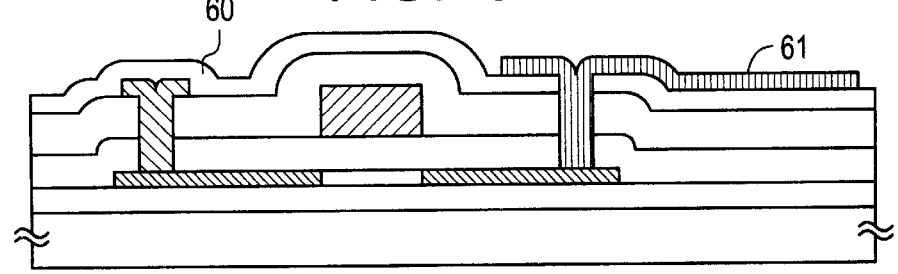
Figure 20:
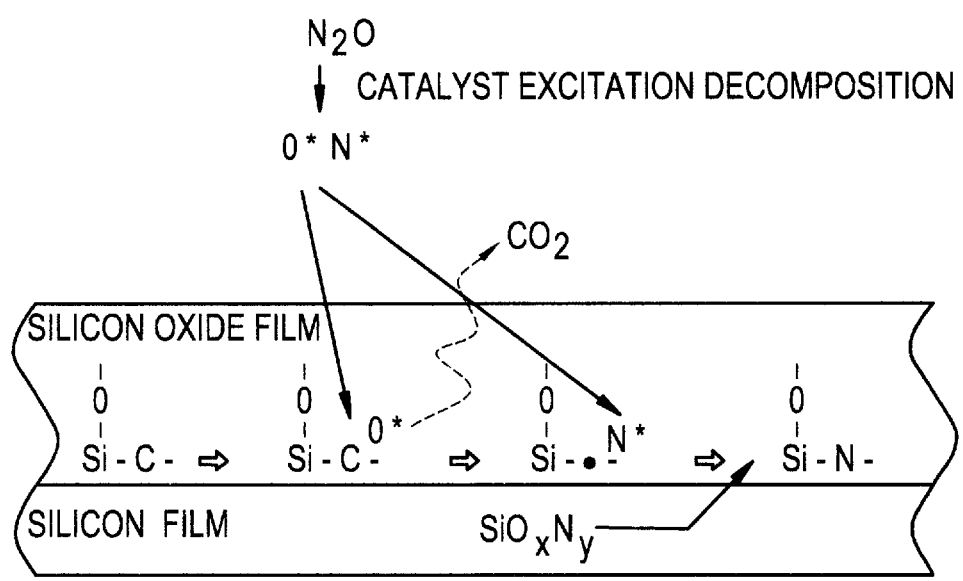
FIG. 20 is a diagram illustrating the effect of the present invention.
Figure 21:
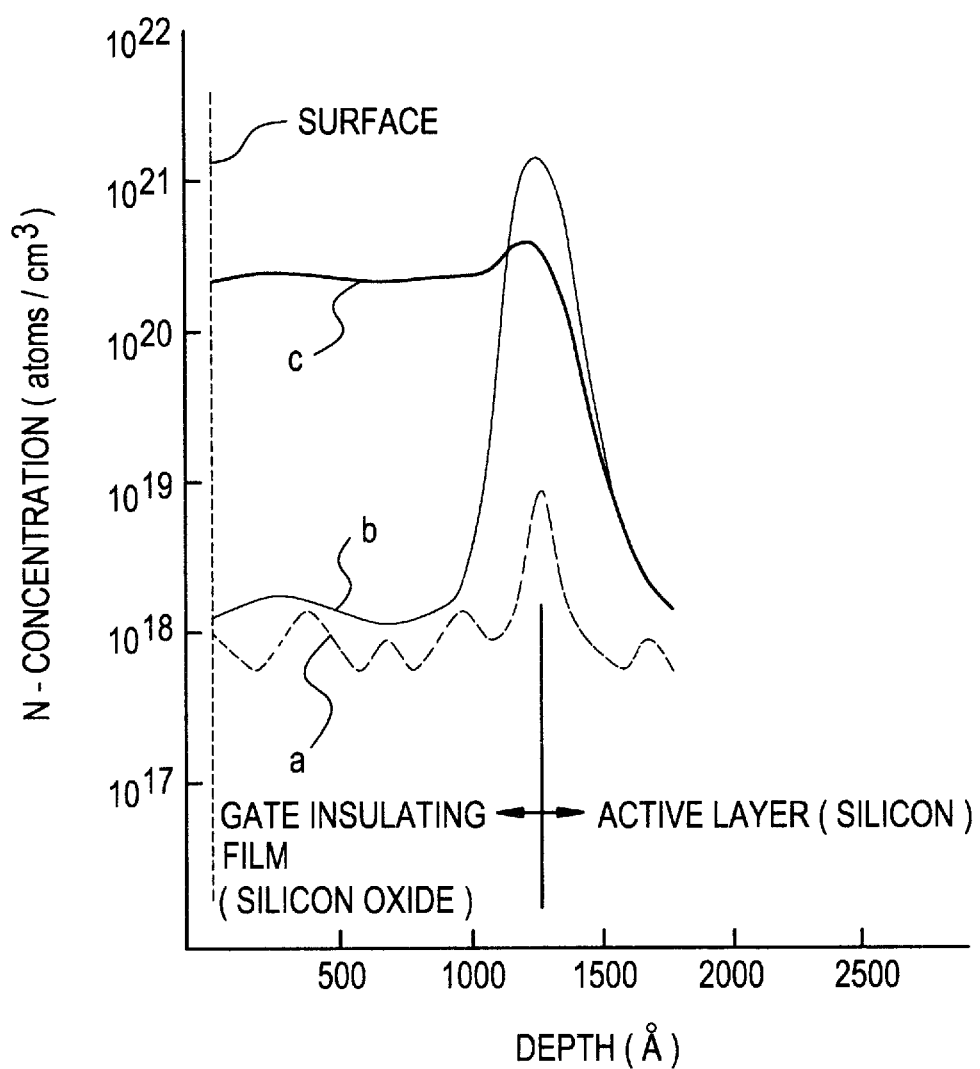
FIG. 21 is a diagram showing the nitrogen concentration in the silicon oxide film which has been treated according to the present invention.

Subsequently, a silicon nitride film, 2000 Å thick, as the passivation film 60, is formed by plasma CVD. Etching is performed on the passivation film 60, the interlayer insulating film 58, and the gate insulating film 55 to form contact holes in the drain region. Finally, an ITO film is formed by sputtering and it is etched to form the picture element electrode 61. In this way there is obtained the desired picture element TFT. (FIG. 19F)

As mentioned above, the present invention produces the effect of greatly improving the characteristic properties of TFT, by reducing the recombination centers at the interface between the gate insulating film and the active layer. This leads to the improvement of S value, field effect mobility, and the voltage resistance and TDB (time dependence dielectric breakdown) of the gate insulating film itself. The improvement in the characteristic properties of the gate insulating film and interface reduces the defect that injected hot electrons are trapped by the gate insulating film. This alleviates the hot carrier degradation due to hot electrons and hence leads to the improved reliability of the element.

While the thermal oxidation film formed according to the present invention is thin, it is completely free of pin holes. This contributes to improved yields. By contrast, the gate insulating film formed by PVD or CVD of various kinds according to the conventional technology tends to give rise to flakes and particles. This leads to a low productivity due to time-consuming maintenance of the apparatus. The substantial absence of flakes and particles in the present invention helps improve productivity because of reduced time for maintenance of the apparatus. The initial investment required to practice the present invention is equal to or smaller than that for the conventional PVD and CVD.

According to the present invention, the maximum processing temperature of the element is lower than 700° C., preferably lower than 650° C. This is of great industrial advantage. The foregoing examples are concerned mostly with TFT formed on a glass substrate. However, it is apparent that the present invention can be effectively applied to multilayered integrate circuits (three-dimensional integrated circuits). Thus, the present invention is of great industrial use.

What is claimed is:

1. A method for forming semiconductor device comprising the steps of:

forming an island silicon region including crystallinity on a substrate having an insulating surface;

forming a thermal oxidation film as a gate insulating film by thermally oxidizing the silicon film, the thermal oxidation film covering the silicon film; and annealing the thermal oxidation film at 400° to 700° C. in an atmosphere including nitrogen oxide which is excited or decomposed by ultraviolet light.

2. The method of claim 1 further comprising the steps of:

forming on the insulating surface an amorphous silicon film having an element which promotes crystallization of amorphous silicon at a concentration of at least $1\times10^{15}$ to $3\times10^{19}$ atoms/cm$^3$ as determined by secondary ion mass spectrometry; and crystallizing the amorphous silicon film to form the island silicon region.

3. The method of claim 1 wherein the substrate includes a glass material containing silicon, oxygen and boron, and has a strain point of 550° to 680° C.

4. A method for forming semiconductor device comprising the step of:

forming an island silicon region including crystallinity on a substrate having an insulating surface;

forming a gate insulating film including silicon oxide by one of chemical vapor deposition and physical vapor deposition, the gate insulating film covering the island silicon region; and annealing the gate insulating film at 400° to 700° C. in an atmosphere including nitrogen oxide which is excited or decomposed by ultraviolet light.

5. The method of claim 4 further comprising the steps of:

forming on the insulating surface an amorphous silicon film having an element which promotes crystallization of amorphous silicon at a concentration of at least $1\times10^{15}$ to $3\times10^{19}$ atoms/cm$^3$ as a result by secondary ion mass spectrometry; and crystallizing the amorphous silicon film to form the island silicon region.

6. The method of claim 4 wherein the gate insulating film is formed by sputtering.

7. The method of claim 4 wherein the gate insulating film is formed by electron cyclotron resonance chemical vapor deposition.

8. The method of claim 4 wherein the gate insulating film is formed by chemical vapor deposition using tetra ethoxy silane as a raw material.

9. The method of claim 4 wherein the gate insulating film is formed by one of low pressure chemical vapor deposition and plasma chemical vapor deposition using monosilane and oxygen or nitrogen oxide as raw materials.

10. The method of claim 4 wherein the substrate includes a glass material containing silicon, oxygen and boron, and has a strain point of 550° to 680° C.

11. The method of claim 4 wherein the gate insulating film further includes nitrogen at a concentration of $1\times10^{17}$ to $1\times10^{21}$ atoms/cm$^3$.

12. A method for forming semiconductor device comprising the steps of:

forming an island silicon region including crystallinity on a substrate having an insulating surface;

forming a gate insulating film including silicon oxide by one of thermal oxidization, chemical vapor deposition and physical vapor deposition, the gate insulating film covering the island silicon region; and annealing the insulating film at 400° to 700° C. in an atmosphere including one of nitrogen oxide and hydrogen nitride which are excited or decomposed by catalyst.

13. The method of claim 12 further comprising the steps of:

forming on the insulating surface an amorphous silicon film having an element which promotes crystallization of amorphous silicon at a concentration of at least $1\times10^{15}$ to $3\times10^{19}$ atoms/cm$^3$ as determined by secondary ion mass spectrometry; and crystallizing the amorphous silicon film to form the island silicon region.

14. The method of claim 12 wherein the gate insulating film is formed by sputtering.

15. The method of claim 12 wherein the gate insulating film is formed by electron cyclotron resonance chemical vapor deposition.

16. The method of claim 12 wherein the gate insulating film is formed by chemical vapor deposition using tetra ethoxy silane as a raw material.

17. The method of claim 12 wherein the gate insulating film is formed by one of low pressure chemical vapor deposition and plasma chemical vapor deposition using monosilane and oxygen or nitrogen oxide as raw materials.

18. The method of claim 12 wherein the substrate includes a glass material containing silicon, oxygen and boron, and has a strain point of 550° to 680° C.

19. The method of claim 12 wherein the gate insulating film further includes nitrogen at a concentration of $1\times10^{17}$ to $1\times10^{21}$ atoms/cm$^3$.

20. A method of manufacturing a semiconductor device comprising the steps of:

forming a semiconductor layer comprising silicon in a shape of an island over a substrate by chemical vapor deposition;

forming a gate insulating film on said semiconductor layer by electron cyclotron resonance chemical vapor deposition utilizing a reactive gas comprising silane and a nitrogen oxide gas;

annealing said gate insulating film in an atmosphere including a nitrogen containing gas; and then forming a gate electrode on said gate insulating film.

21. A method according to claim 20 wherein said nitrogen oxide gas comprises dinitrogen monoxide.

22. A method of manufacturing a semiconductor device comprising the steps of:

forming a crystalline semiconductor layer comprising silicon in a shape of an island on an insulating surface of a substrate;

forming a gate insulating film comprising silicon oxide on said semiconductor layer;

annealing said gate insulating film in an atmosphere including a nitrogen containing gas excited by UV light; and then forming a gate electrode on said gate insulating film.

23. A method according to claim 22 wherein said crystalline semiconductor layer contains a catalyst element for promoting crystallization of silicon in a concentration not higher than $3\times10^{19}$ atoms/cm$^3$.

24. A method according to claim 23 wherein said concentration is determined by a minimum value of a secondary ion mass spectrometry.

25. A method according to claim 22 wherein said UV light is emitted by a mercury lamp.

* * * * *